(12) United States Patent
Yoshimura et al.

(10) Patent No.: US 7,709,182 B2
(45) Date of Patent: May 4, 2010

(54) COMPOSITION FOR FORMING ANTIREFLECTION FILM, LAYERED PRODUCT, AND METHOD OF FORMING RESIST PATTERN

(75) Inventors: Nakaatsu Yoshimura, Tokyo (JP); Keiji Konno, Tokyo (JP)

(73) Assignee: JSR Corporation, Tokyo (JP)

( * ) Notice: Subject to any disclaimer, the term of this patent is extended or adjusted under 35 U.S.C. 154(b) by 245 days.

(21) Appl. No.: 11/792,077

(22) PCT Filed: Nov. 28, 2005

(86) PCT No.: PCT/JP2005/021756

§ 371 (c)(1),
(2), (4) Date: Jun. 1, 2007

(87) PCT Pub. No.: WO2006/059555

PCT Pub. Date: Jun. 8, 2006

(65) Prior Publication Data

US 2008/0124524 A1 May 29, 2008

(30) Foreign Application Priority Data

Dec. 3, 2004 (JP) ............................. 2004-350632

(51) Int. Cl.
G03F 7/11 (2006.01)
G03F 7/30 (2006.01)

(52) U.S. Cl. .................... 430/273.1; 430/326; 430/311; 525/245

(58) Field of Classification Search ........................ None
See application file for complete search history.

(56) References Cited

U.S. PATENT DOCUMENTS

| 5,514,526 | A | | 5/1996 | Nishi et al. | |
|---|---|---|---|---|---|
| 5,611,850 | A | * | 3/1997 | Nishi et al. | 106/287.26 |
| 5,631,314 | A | * | 5/1997 | Wakiya et al. | 524/165 |
| 2003/0129534 | A1 | * | 7/2003 | Yamazaki et al. | 430/273.1 |
| 2004/0072420 | A1 | | 4/2004 | Enomoto et al. | |
| 2006/0024613 | A1 | * | 2/2006 | Otozawa et al. | 430/270.1 |

FOREIGN PATENT DOCUMENTS

| EP | 0043108 | A | | 1/1982 |
|---|---|---|---|---|
| JP | 60-052845 | | | 3/1985 |
| JP | 02-025850 | | | 1/1990 |
| JP | 06-051523 | | | 2/1994 |
| JP | 6148896 | A | | 5/1994 |
| JP | 07-234514 | | | 9/1995 |
| JP | 09-006008 | | | 1/1997 |
| JP | 09-50129 | A | * | 2/1997 |
| JP | 09-90615 | A | * | 9/1997 |
| JP | 10-010742 | | | 1/1998 |
| JP | 59-45439 | | | 3/1998 |
| JP | 2002-105433 | A | * | 4/2002 |
| JP | 2004054209 | A | | 2/2004 |
| WO | 92/05474 | | | 1/1997 |
| WO | WO-01/03873 | A1 | * | 5/2001 |
| WO | WO 2005/072487 | A2 | * | 8/2005 |

OTHER PUBLICATIONS

English translation of JP, 07-234514, A (1995) from machine translation from AIPN Japan Patent Office National center for Industrial Property Information and Training, generated Mar. 13, 2009, 28 pages.*
English translation of JP, 09-006008, A (1997) from machine translation from AIPN Japan Patent Office National center for Industrial Property Information and Training, generated Mar. 13, 2009, 11 pages.*
English translation of JP, 2002-105433, A (2002) from machine translation from AIPN Japan Patent Office National center for Industrial Property Information and Training, generated Mar. 13, 2009, 19 pages.*
English translation of JP, 09-50129, A (1997) from machine translation from AIPN Japan Patent Office National center for Industrial Property Information and Training, generated Mar. 13, 2009, 13 pages.*
English translation of JP, 09-090615, A(1997) from machine translation from AIPN Japan Patent Office National center for Industrial Property Information and Training, generated Oct. 25, 2009, 13 pages.*
Shinoda et al, "The Physicochemical Properties of aqueous solutions of Flurinated Surfactants", The Journal of Physical Chemistry, vol. 76, No. 6, 1972 pp. 909-914.*
English translation of JP, 06-148896, A (1994) from machine translation from AIPN Japan Patent Office National center for Industrial Property Information and Training, generated Oct. 25, 2009, 7 pages.*
English translation of JP, 2004-054209, A (2004) from machine translation from AIPN Japan Patent Office National center for Industrial Property Information and Training, generated Oct. 25, 2009, 36 pages.*
MacDonald et al., "Airborne Chemical Contamination of A Chemically Amplified Resist," SPIE, vol. 1466, Advances in Resist Technology and Processing VIII (1991) (pp. 2-12).
Tanaka et al., "A New Photolithography Technique with Antireflective Coating on Resist: ARCOR," J. Electrochem. Soc., vol. 137, No. 12, (1990) (pp. 3900-3905).

* cited by examiner

*Primary Examiner*—Cynthia Hamilton
(74) *Attorney, Agent, or Firm*—Ditthavong Mori & Steiner, P.C.

(57) ABSTRACT

An antireflection film-forming composition which has excellent applicability, is significantly inhibited from generating ultrafine microbubbles, gives an antireflection film capable of sufficiently reducing the standing-wave effect, and has excellent solubility in water and an alkaline developing solution. The antireflection film-forming composition contains: (A) a copolymer (salt) of a sulfonic acid group-containing acrylamide derivative represented by, e.g., 2-(meth)acrylamido-2-methylpropanesulfonic acid and a fluoroalkyl group-containing acrylic acid ester derivative represented by, e.g., 2,2,3,3,3-pentafluoropropyl (meth)acrylate; and (B) a surfactant whose 0.1 wt. % aqueous solution has a surface tension as measured at 25° C. of 45 mN/m or lower.

14 Claims, 1 Drawing Sheet

COMPOSITION FOR FORMING ANTIREFLECTION FILM, LAYERED PRODUCT, AND METHOD OF FORMING RESIST PATTERN

FIELD OF THE INVENTION

The present invention relates to an antireflection film-forming composition suitable for microfabrication using a lithography process, in which a resist responding to various radiations such as a chemically-amplified resist is used, a layered product with an antireflection film formed from the antireflection film-forming composition on a resist film, and a method for forming a resist pattern using the antireflection film-forming composition.

BACKGROUND OF THE INVENTION

In the fields of microfabrication represented by fabrication of integrated circuit devices, the processing size has become more and more minute in order to achieve higher integration in a lithography process. In recent years, development of a lithographic process enabling stable microfabrication with a line width of 0.5 µm or less has been actively proceeding.

However, it is difficult to form such a fine pattern with high accuracy using a conventional method utilizing visible rays (wavelength: 800 to 400 nm) or near ultraviolet rays (wavelength: 400 to 300 nm). To deal with this problem, a lithographic process using radiation with a shorter wavelength (wavelength: 300 nm or less) that can achieve a wider depth of focus and is effective for ensuring design rules with minimum dimensions has been proposed. As a lithographic process using radiation with such a short wavelength, processes using deep ultraviolet rays such as KrF excimer laser (wavelength: 248 nm), or an ArF excimer laser (wavelength: 193 nm), X-rays such as synchrotron radiation, and charged particle rays such as electron beams have been proposed. A chemically-amplified resist has attracted attention as a resist exhibiting high resolution for such short wavelength radiation. At present, development and improvement of the chemically-amplified resist are important technical issues of the lithographic process.

The chemically-amplified resist contains a compound which generates an acid upon irradiation. Chemical changes in the resist film (changes in polarity, breakage of a chemical bond, cross-linking reaction, etc.) caused by the catalytic action of an acid change solubility of the exposed area in a developer. A pattern is formed utilizing this phenomenon.

A number of compositions for chemically-amplified resists, for example, a combination of a resin containing an alkali-soluble resin, in which the groups exhibiting affinity with an alkali are protected by a t-butyl ester group or t-butoxy carbonyl group, with an acid generator (see, for example, Patent Document 1); a combination of a resin containing an alkali-soluble resin, in which the groups exhibiting affinity with an alkali are protected by a silyl group, with an acid generator (see, for example, Patent Document 2); a combination of an acetal group-containing resin with an acid generator (see, for example, Patent Document 3); a combination of an alkali-soluble resin, a dissolution controller, and an acid generator, a combination of a novolac resin, a crosslinking agent, and an acid generator; and the like have been proposed.

Patent Document 1: Japanese Laid-Open Patent Publication No. 59-45439

Patent Document 2: Japanese Laid-Open Patent Publication No. 60-52845

Patent Document 3: Japanese Laid-Open Patent Publication No. 2-25850

These chemically-amplified resists, however, have a problem with respect to the process stability, because the compositions are easily affected by moisture, oxygen, basic substances, and the like that are present in the atmosphere for the lithographic process. Non-Patent Document 1, for example, reports that a very small amount of dimethylaniline in the atmosphere deactivates acids existing near the surface among the acids produced in the resist film by exposure, and forms a scarcely soluble layer on the surface of a resist film, which layer remains in the form of an eave-like projection on the surface of a resist pattern after development. Not only such a scarcely soluble layer decreases sensitivity and resolution of the resist, but also the eave-like projections formed in the resist pattern adversely affect the etching accuracy. The size of the eave-like projections tends to increase along with an increase of the time for which the resist is allowed to stand between each of the steps of exposure, post exposure baking, and development. This phenomenon is known as post exposure time delay (hereinafter referred to as "PED", which unduly decreases the allowance of time in the lithographic process.

Non-Patent Document 1: SPIE, Vol. 1466, "Advance in Resist Technology and Processing," p. 2 (1991)

As a method for solving such problems of PED, a method of laminating an overcoat on the chemically-amplified resist film to block the film surface from the atmosphere has been proposed. For example, Non-Patent Document 2 describes a method of laminating an overcoat of polyacrylic acid, polyvinyl butyral, polyvinyl alcohol, polystyrene sulfonic acid, or the like on the chemically-amplified resist film to inhibit invasion of basic materials into the resist film, thereby preventing a decrease of sensitivity and resolution of the resist. However, among such overcoats, polyacrylic acid, polyvinyl butyral, and polyvinyl alcohol cannot necessarily effectively prevent formation of the aforementioned scarcely-soluble layer, although they have a barrier effect. Polystyrene sulfonate, which has too strong acidity, has a drawback of initiating a chemical reaction due to the catalytic action of the acid in the chemically-amplified resist irrespective of exposure to light. Another problem with the overcoat, which is commonly applied to a resist film as an aqueous solution, is uneven coating due to insufficient wetting properties of the aqueous solution with the resist film.

Non-Patent Document 2: WO92/05474

On the other hand, since radiation commonly used in the lithographic process is light with a single wavelength, incidence radiation interferes with light reflected by the boundary surfaces on the top and bottom of the resist film. As a result, a phenomenon called "a standing-wave effect" or "a multiplex interference effect", which is a phenomenon in which an effectual dose of radiation to which a resist film is exposed fluctuates due to mutual interference of radiations in the film according to fluctuation of the resist film thickness, irrespective of a constant actual dose of radiation, occurs and adversely affects formation of resist patterns. If the coating thickness varies due to slight difference of a resist composition, viscosity, resist film conditions, and the like, or the coating thickness fluctuates due to steps in the substrates (recessed parts are thicker than projected parts), such a film thickness difference changes the effectual dose of radiation to which a resist film is exposed, resulting in fluctuation of pattern dimensions and a decrease in accuracy of the resist pattern dimensions.

To overcome this problem caused by the standing-wave effect, a method of forming an antireflection film on the resist film to inhibit reflection on the coating surface and reduce multiplex interference in the film has been proposed. For example, a method of reducing the standing-wave effect by laminating layers of polysiloxane, poly(ethyl vinyl ether), polyvinyl alcohol, or the like as an antireflection film on a resist film is described in Non-Patent Document 3. In this instance, the reflex inhibition effect on the surface of the resist film mainly depends on the refractive index and film thickness of the antireflection film. The refractive index of an ideal antireflection film is the square root on n (n is the refractive index of the resist), and the thickness of an ideal antireflection film is an anisoploid of λ/4m (wherein λ is the wavelength of radiation and m is the refractive index of the antireflection film).

Non-Patent Document 3: J. Eectrochem. Soc., Vol. 137, No. 12, p. 3900 (1990)

However, the antireflection film made from polysiloxane, poly(ethyl vinyl ether), or polyvinyl alcohol has a basic problem of being incapable of sufficiently inhibiting the standing-wave effect due to the small difference of the refractive index with that of a resist film. In addition, the antireflection film made from polysiloxane which is insoluble in water or a developer must have a separate step of removing the antireflection film before development using an antireflection film removing agent. The solubility in water or a developer of poly(ethyl vinyl ether) or polyvinyl alcohol is not necessarily sufficient. The antireflection film made from these polymers may have leave residues on the resist film which impair resist performance such as resolution, developability, pattern profile, and the like. An additional problem of the overcoat which is applied to a resist film as an aqueous solution such as poly(ethyl vinyl ether) or polyvinyl alcohol is uneven coating due to insufficient wetting properties of the aqueous solution with the resist film.

In order to solve the problems in conventional antireflection films mentioned above, the inventor of the present invention has proposed (a) a copolymer of an acrylamide compound such as 2-acrylamide-2-methylpropane sulfonic acid in which the amide group has a sulfonic acid group bonded to the nitrogen atom via an organic group, and a fluoroalkyl acrylate compound such as 2,2,3,3,3-pentafluoropropyl acrylate and (b) a basic material blocking antireflection film containing a fluoroalkylsulfonic acid having an fluoroalkyl group with 5 to 15 carbon atoms and/or a fluoroalkylcarboxylic acid having an fluoroalkyl group with 5 to 15 carbon atoms, and a resist pattern forming method using the antireflection film (see Patent Document 4). This antireflection film can reduce the effect of a basic substance in the atmosphere and the standing-wave effect. However, the composition used for forming the antireflection film has a problem in coatability onto a resist film, which results in production of microbubbles in the order of μm in the formed coating.

Patent Document 4: Japanese Laid-Open Patent Publication No. 7-234514

SUMMARY OF THE INVENTION

An object of the present invention is to provide an antireflection film-forming composition having excellent coatability, capable of significantly inhibiting production of fine micro-bubbles and capable of forming an antireflection film with a sufficiently decreased standing-wave effect, and having excellent solubility in water and alkaline developers, a layered product with an antireflection film formed from the antireflection film-forming composition on a resist film, and a method for forming a resist pattern using the composition for forming a basic material blocking antireflection film.

A first aspect of the present invention provides an antireflection film-forming composition, the composition being characterized by including: (A) a copolymer having at least one repeating unit represented by the following formula (1) and at least one repeating unit represented by the following formula (2) and/or a salt of the copolymer; and (B) a surfactant the surface tension of which of an aqueous solution at 25° C. and at a concentration of 0.1% by weight is 45 mN/m or less:

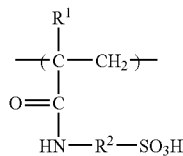
(1)

wherein in formula (1) $R^1$ represents a hydrogen atom or a monovalent organic group and $R^2$ represents a divalent organic group; and

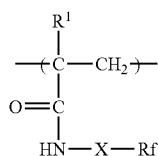
(2)

wherein in formula (2) $R^3$ represents a hydrogen atom or a monovalent organic group, Rf represents a fluoroalkyl group, and X represents a direct bond, an alkylene group or a fluoroalkylene group.

A second aspect of the present invention provides a layered product fabricated by forming an antireflection film formed of the above antireflection film-forming composition on a resist coating film.

A third aspect of the present invention provides a method of forming a resist pattern in which a resist coating film is formed on a substrate, and the resist coating film is irradiated with radiation and successively developed to form a resist pattern, the method being characterized by including the steps in which on the above-mentioned resist coating film, an antireflection film is beforehand formed of the antireflection film-forming composition according to any one of claims 1 to 4, and thereafter the above-mentioned resist coating film is irradiated with radiation in a predetermined pattern and then developed to remove the above-mentioned antireflection film.

Hereinafter, detailed description will be made of the present invention.

Antireflection Film-forming Composition

—(A) Component—

The (A) component in the present invention includes a copolymer (hereinafter referred to as the "copolymer (α)") having at least one repeating unit (hereinafter referred to as the "repeating unit (1)") represented by the above-described formula (1) and at least one repeating unit (hereinafter referred to as the "repeating unit (2)") represented by the above-described formula (2) and/or a salt of the copolymer (hereinafter the copolymer (α) and the salt thereof are collectively referred to as the "(A) copolymer (salt)").

The copolymer (α) can be prepared by copolymerizing a monomer mixture including a sulfonic acid group-containing acrylamide derivative (hereinafter referred to as the "acrylamide derivative (i)") corresponding to the repeating unit (1) and a fluoroalkyl group-containing acrylic acid ester derivative (hereinafter referred to as the "acrylic acid ester derivative (ii)) corresponding to the repeating unit (2).

In formula (1), a monovalent organic group represented by $R^1$ and a divalent organic group represented by $R^2$ each may be a straight chain group, a branched group or a cyclic group.

Preferred as the monovalent organic group represented by $R^1$ is a group having 1 to 12 carbon atoms. Examples of such a group may include: a carboxyl group; a cyano group; alkyl groups each having 1 to 12 carbon atoms such as a methyl group, an ethyl group, a n-propyl group, an i-propyl group, a n-butyl group, an i-butyl group, a sec-butyl group, a t-butyl group, a n-pentyl group and a n-hexyl group; carboxyalkyl groups each having 2 to 12 carbon atoms such as a carboxymethyl group, a 2-carboxyethyl group, a 2-carboxypropyl group, a 3-carboxypropyl group, a 2-carboxybutyl group, a 3-carboxybutyl group and a 4-carboxybutyl group; alkoxycarbonyl groups each having 2 to 12 carbon atoms such as a methoxycarbonyl group, an ethoxycarbonyl group, a n-propoxycarbonyl group, an i-propoxycarbonyl group, a n-butoxycarbonyl group and a t-butoxycarbonyl group; acyloxy groups each having 2 to 12 carbon atoms such as an acetyloxy group, a propionyloxy group, a butanoyloxy and a benzoyloxy group; aryl groups each having 6 to 12 carbon atoms such as a phenyl group and a cumenyl group; aralkyl groups each having 7 to 12 carbon atoms such as a benzyl group and an α-methylbenzyl group; alkoxyl groups each having 1 to 12 carbon atoms such as a methoxy group, an ethoxy group, a n-propoxy group, an i-propoxy group, a n-butoxy group and a t-butoxy group; alkoxyalkyl groups each having 2 to 12 carbon atoms such as a methoxymethyl group, an ethoxymethyl group, a 2-methoxyethyl group, a 2-ethoxyethyl group, a 2-methoxypropyl group, a 3-methoxypropyl group, a 2-methoxybutyl group, a 3-methoxybutyl group and 4-methoxybutyl group; cycloalkyl groups each having 3 to 12 carbon atoms such as a cyclopentyl group, a cyclohexyl group, a cycloheptyl group and a cyclooctyl group, and substituted derivatives of these groups.

In formula (1), $R^1$ is preferably a hydrogen atom, a methyl group or the like.

Preferred as the divalent organic group represented by $R^2$ is a group having 1 to 12 carbon atoms. Examples of such a group may include: a methylene group, an ethylene group, a 1,2-propylene group, a 1,3-propylene group, a 1,1-dimethylethylene group, a 1-methyl-1,3-propylene group, a 1,4-butylene group, a 1-methyl-1,4-butylene group, a 2-methyl-1,4-butylene group, a 1,5-pentylene group, a 1,1-dimethyl-1,4-butylene group, a 2,2-dimethyl-1,4-butylene group, a 1,2-dimethyl-1,4-butylene group, a 1,6-hexylene group, a 1,3-cyclopentylene group, and a 1,4-cyclohexylene group.

Particularly preferred among these divalent organic groups is a 1,1-dimethylethylene group.

Specific examples of the acrylamide derivative (i) may include: 2-(meth)acrylamido-2-methylpropanesulfonic acid, 2-α-carboxyacrylamido -2-methylpropanesulfonic acid, 2-α-carboxymethylacrylamido-2-methylpropanesulfonic acid, 2-α-methoxycarbonylacrylamido-2-methylpropanesulfonic acid, 2-α-acetyloxyacrylamido-2-methylpropanesulfonic acid, 2-α-phenylacrylamido-2-methylpropanesulfonic acid, 2-α-benzylacrylamido-2-methylpropanesulfonic acid, 2-α-methoxyacrylamido-2-methylpropanesulfonic acid, 2-α-(2-methoxyethyl) acrylamido-2-methylpropanesulfonic acid, 2-α-cyclohexylacrylamido-2-methylpropanesulfonic acid, and 2-α-cyanoacrylamido-2-methylpropanesulfonic acid.

In the present invention, particularly preferred as the acrylamide derivative (i) is 2-(meth)acrylamido-2-methylpropanesulfonic acid.

Next, in formula (2), the monovalent organic group represented by $R^3$ may be a straight chain group, a branched group or a cyclic group.

Additionally, the fluoroalkyl group represented by Rf may be a straight chain group, a branched group or a cyclic group, and may be either a hydrofluoroalkyl group or a perfluoroalkyl group.

Further, the fluoroalkylene group represented by A may be a straight chain group, a branched group or a cyclic group, and may be either a hydrofluoroalkylene group or a perfluoroalkylene group.

Preferred as the monovalent organic group represented by $R^3$ is a group having 1 to 12 carbon atoms, and examples of such a group may include the same groups as shown for the monovalent organic group having 1 to 12 carbon atoms represented by $R^1$ in formula (1).

In formula (2), preferred as $R^3$ is a hydrogen atom, a methyl group and the like.

Preferred as the fluoroalkyl group represented by Rf is a group having 1 to 15 carbon atoms, and examples of such a group may include:

a difluoromethyl group and a trifluoromethyl group;

a 2,2-difluoroethyl group, a 2,2,2-trifluoroethyl group and a pentafluoroethyl group;

a 1-(trifluoromethyl)ethyl group, a 2-(trifluoromethyl)ethyl group, a 2,2,3,3-tetrafluoropropyl group, a (pentafluoroethyl)methyl group, a di(trifluoromethyl)methyl group and a heptafluoropropyl group;

a 1-methyl-2,2,3,3-tetrafluoropropyl group, a 1-(pentafluoroethyl)ethyl group, a 2-(pentafluoroethyl)ethyl group, a 2,2,3,3,4,4-hexafluorobutyl group, a 2,2,3,4,4,4-hexafluorobutyl group, a (heptafluoropropyl)methyl group and a nonafluorobutyl group;

a 1,1-dimethyl-2,2,3,3-tetrafluoropropyl group, a 1,1-dimethyl-2,2,3,3,3-pentafluoropropyl group, a 1-methyl-2,2,3,3,4,4-hexafluorobutyl group, a 1-(heptafluoropropyl)ethyl group, a 2-(heptafluoropropyl)ethyl group, a 2,2,3,3,4,4,5,5-octafluoropentyl group, a (nonafluorobutyl)methyl group and a perfluoropentyl group;

a 1,1-dimethyl-2,2,3,3,4,4-hexafluorobutyl group, a 1,1-dimethyl-2,2,3,3,4,4,4-heptafluorobutyl group, a 1-methyl-2,2,3,3,4,4,5,5-octafluoropentyl group, a 1-(nonafluorobutyl)ethyl group, a 2-(nonafluorobutyl)ethyl group, a 2,2,3,3,4,4,5,5,6,6-decafluorohexyl group, a (perfluoropentyl)methyl group and a perfluorohexyl group;

a 1,1-dimethyl-2,2,3,3,4,4,5,5-octafluoropentyl group, a 1,1-dimethyl-2,2,3,3,4,4,5,5,5-nonafluoropentyl group, a 1-methyl-2,2,3,3,4,4,5,5,6,6-decafluorohexyl group, a 1-(perfluoropentyl)ethyl group, a 2-(perfluoropentyl)ethyl group, a 2,2,3,3,4,4,5,5,6,6,7,7-dodecafluoroheptyl group, a (perfluorohexyl)methyl group and a perfluoroheptyl group;

a 1-(perfluorohexyl)ethyl group, a 2-(perfluorohexyl)ethyl group, a 2,2,3,3,4,4,5,5,6,6,7,7,8,8-tetradecafluorooctyl group, a (perfluoroheptyl)methyl group and a perfluorooctyl group;

a 1-(perfluoroheptyl)ethyl group, a 2-(perfluoroheptyl)ethyl group, a 2,2,3,3,4,4,5,5,6,6,7,7,8,8,9,9-hexadecafluorononyl group, a (perfluorooctyl)methyl group and a perfluorononyl group; and a 1-(perfluorooctyl)ethyl group, a 2-(perfluorooctyl)ethyl group, a 2,2,3,3,4,4,5,5,6,6,7,7,8,8,9,9,10,10-octadecafluorodecyl group, a (perfluorononyl)methyl group, and a perfluorodecyl group.

In formula (2), preferred as Rf are a 2,2,2-trifluoroethyl group, a (pentafluoroethyl)methyl group, a 2-(perfluorooctyl)ethyl group and the like.

Additionally, preferred as an alkylene group represented by X is a group having 1 to 5 carbon atoms, and examples of such a group may include: a methylene group, an ethylene group, a 1,2-propylene group, a 1,3-propylene group, a 1,1-dimethylethylene group, a 1-methyl-1,3-propylene group, and a 1,4-butylene group.

Preferred as a fluoroalkylene group represented by A is a group having 1 to 5 carbon atoms, and examples of such a group may include: a difluoromethylene group, a 1,1-difluoroethylene group, a tetrafluoroethylene group, a 1,1-difluoro-1,2-propylene group, a 2,2,3,3-tetrafluoro-1,3-propylene group, a hexafluoro-1,3-propylene group, a 1,1-dimethyl-2,2-difluoroethylene group, a 1-methyl-2,2,3,3-tetrafluoro-1,3-propylene group, a 2,2,3,3,4,4-hexafluoro-1,4-butylene group, and an octafluoro-1,4-butylene group.

In formula (2), particularly preferred as X is a direct bond.

Specific examples of the acrylic acid ester derivative (ii) may include the following fluoroalkyl (meth)acrylates each containing a fluoroalkyl group having 1 to 10 carbon atoms:
difluoromethyl (meth)acrylate and trifluoromethyl (meth)acrylate;
2,2-difluoroethyl (meth)acrylate, 2,2,2-trifluoroethyl (meth)acrylate and pentafluoroethyl (meth)acrylate;
1-(trifluoromethyl)ethyl (meth)acrylate, 2-(trifluoromethyl)ethyl (meth)acrylate, 2,2,3,3-tetrafluoropropyl (meth)acrylate, (pentafluoroethyl)methyl (meth)acrylate, di(trifluoromethyl)methyl (meth)acrylate and heptafluoropropyl (meth)acrylate;
1-methyl-2,2,3,3-tetrafluoropropyl (meth)acrylate, 1(pentafluoroethyl)ethyl (meth)acrylate, 2-(pentafluoroethyl)ethyl (meth)acrylate, 2,2,3,3,4,4-hexafluorobutyl (meth)acrylate, (heptafluoropropyl)methyl (meth)acrylate and nonafluorobutyl (meth)acrylate;
1,1-dimethyl-2,2,3,3-tetrafluoropropyl (meth)acrylate, 1,1-dimethyl-2,2,3,3,3-pentafluoropropyl (meth)acrylate, 2-(heptafluoropropyl)ethyl (meth)acrylate, 2,2,3,3,4,4,5,5-octafluoropentyl (meth)acrylate group, (nonafluorobutyl)methyl (meth)acrylate and perfluoropentyl (meth)acrylate;
1,1-dimethyl-2,2,3,3,4,4-hexafluorobutyl (meth)acrylate, 1,1-dimethyl-2,2,3,3,4,4,4-heptafluorobutyl (meth)acrylate, 2-(nonafluorobutyl)ethyl (meth)acrylate, 2,2,3,3,4,4,5,5,6,6-decafluorohexyl (meth)acrylate, (perfluoropentyl)methyl (meth)acrylate and perfluorohexyl (meth)acrylate;
1,1-dimethyl-2,2,3,3,4,4,5,5-octafluoropentyl (meth)acrylate, 1,1-dimethyl-2,2,3,3,4,4,5,5,5-nonafluoropentyl (meth)acrylate, 2-(perfluoropentyl)ethyl (meth)acrylate, 2,2,3,3,4,4,5,5,6,6,7,7-dodecafluoroheptyl (meth)acrylate, (perfluorohexyl)methyl (meth)acrylate and perfluoroheptyl (meth)acrylate;
2-(perfluorohexyl)ethyl (meth)acrylate, 2,2,3,3,4,4,5,5,6,6,7,7,8,8-tetradecafluorooctyl (meth)acrylate, (perfluoroheptyl)methyl (meth)acrylate and perfluorooctyl (meth)acrylate;
2-(perfluoroheptyl)ethyl (meth)acrylate, 2,2,3,3,4,4,5,5,6,6,7,7,8,8,9,9-hexadecafluorononyl (meth)acrylate, (perfluorooctyl)methyl (meth)acrylate and perfluorononyl (meth)acrylate;
2-(perfluorooctyl)ethyl (meth)acrylate, 2,2,3,3,4,4,5,5,6,6,7,7,8,8,9,9,10,10-octadecafluorodecyl (meth)acrylate, (perfluorononyl)methyl (meth)acrylate, and perfluorodecyl (meth)acrylate.

Additionally, specific examples of the acrylic acid ester derivative (ii) may include 2,2,2-trifluoroethyl-α-carboxy acrylate, (pentafluoroethyl)methyl-α-carboxy acrylate;
2,2,2-trifluoroethyl-α-(carboxymethyl)acrylate, (pentafluoroethyl)methyl-α-(carboxymethyl)acrylate;
2,2,2-trifluoroethyl-α-(methoxycarbonyl)acrylate, (pentafluoroethyl)methyl-α-(methoxycarbonyl)acrylate;
2,2,2-trifluoroethyl-α-(acetyloxy) acrylate, (pentafluoroethyl)methyl-α-(acetyloxy) acrylate;
2,2,2-trifluoroethyl-α-phenyl acrylate, (pentafluoroethyl)methyl-α-phenyl acrylate;
2,2,2-trifluoroethyl-α-benzyl acrylate, (pentafluoroethyl)methyl-α-benzyl acrylate;
2,2,2-trifluoroethyl-α-ethoxy acrylate, (pentafluoroethyl)methyl-α-ethoxy acrylate;
2,2,2-trifluoroethyl-α-(2-methoxyethyl)acrylate, (pentafluoroethyl)methyl-α-(2-methoxyethyl)acrylate;
2,2,2-trifluoroethyl-α-cyclohexyl acrylate, (pentafluoroethyl)methyl-α-cyclohexyl acrylate;
2,2,2-trifluoroethyl-α-cyano acrylate, and (pentafluoroethyl)methyl-α-cyano acrylate.

In the present invention, preferred as the acrylic acid ester derivative (ii) are fluoroalkyl (meth)acrylates each containing a fluoroalkyl group having 1 to 10 carbon atoms. Particularly preferred are: perfluoroalkyl (meth)acrylates each containing a perfluoroalkyl group having 1 to 10 carbon atoms; fluoroalkyl (meth)acrylates each containing a perfluoroalkyl group having 1 to 9 carbon atoms and bonded to the ester oxygen atom through a methylene group; and fluoroalkyl (meth)acrylates each containing a perfluoroalkyl group having 1 to 8 carbon atoms and bonded to the ester oxygen atom through an ethylene group.

In the copolymer (α), the copolymerization proportions of the acrylamide derivative (i) and the acrylic acid ester derivative (ii) are as follows on the basis of the total amount of both monomers: the proportion of the acrylamide derivative (i) is usually 1 to 99% by weight, preferably 3 to 50% by weight and particularly preferably 5 to 30% by weight, and the proportion of the acrylic acid ester derivative (ii) is usually 99 to 1% by weight, preferably 97 to 50% by weight and particularly preferably 95 to 70% by weight. In this case, when the copolymerization proportion of the acrylamide derivative (i) is less than 1% by weight and the copolymerization proportion of the acrylic acid ester derivative (ii) exceeds 99% by weight, the solubility in water or an alkaline developer of the obtained antireflection film is degraded, and the pattern profile and the developability tend to be degraded. On the other hand, when the copolymerization proportion of the acrylamide derivative (i) exceeds 99% by weight and the copolymerization proportion of the acrylic acid ester derivative (ii) is less than 1% by weight, the reduction of the standing-wave effect in the antireflection film tends to be insufficient and the film-forming property tends to be degraded.

In the present invention, when the copolymer (α) is prepared, with the acrylamide derivative (i) and the acrylic acid ester derivative (ii), other unsaturated monomers copolymerizable with these derivatives can be copolymerized. In this case, the amount of the other unsaturated monomers to be used is usually 50% by weight or less and preferably 40% by weight or less on the basis of the total amount of the monomers.

Examples of the above-mentioned other unsaturated monomers may include:

unsaturated monocarboxylic acid compounds such as (meth)acrylic acid, crotonic acid, cinnamic acid, atropic acid, 3-acetyloxy(meth)acrylic acid, 3-benzoyloxy(meth)acrylic acid, α-methoxyacrylic acid and 3-cyclohexyl (meth)acrylic acid;

(meth)acrylic acid alkyl ester compounds such as methyl (meth)acrylate, ethyl (meth)acrylate, n-propyl (meth)acrylate, and n-butyl (meth)acrylate, and other unsaturated monocarboxylic acid ester compounds such as methyl crotonate and methyl cinnamate;

unsaturated polycarboxylic acid compounds such as fumaric acid, maleic acid, citraconic acid, mesaconic acid, itaconic acid and the anhydride compounds of these acids;

mono- or di-ester compounds such as the mono- and di-methyl esters, mono- and di-ethyl esters, and mono- and di-n-propyl esters of the above-mentioned unsaturated polycarboxylic acids;

esters of unsaturated alcohols such as vinyl acetate, vinyl propionate and vinyl caproate;

vinyl cyanide compounds such as (meth)acrylonitrile, α-methylacrylonitrile, α-chloroacrylonitrile, α-(chloromethyl)acrylonitrile, α-(trifluoromethyl)acrylonitrile and vinylidene cyanide;

aromatic monovinyl compounds other than those described above such as styrene, α-methylstyrene and vinyltoluene;

halogenated olefin compounds such as vinyl chloride, vinylidene chloride, vinyl fluoride, vinylidene fluoride, tetrafluoroethylene and hexafluoropropylene;

diene compounds such as butadiene, isoprene, chloroprene, piperylene, 2,3-dimethylbutadiene, methylpentadiene, cyclopentadiene, vinylcyclohexene, ethylidenenorbornene, divinylbenzene and dimethylvinylstyrylsilane;

unsaturated ether compounds such as methyl vinyl ether, ethyl vinyl ether and methyl allyl ether;

epoxy group-containing unsaturated compounds such as glycidyl (meth)acrylate and allyl glycidyl ether;

halogen-containing unsaturated compounds other than those described above such as 2-chloroethyl vinyl ether, vinyl chloroacetate, allyl chloroacetate and p-(chloromethyl)styrene;

hydroxy group-containing unsaturated compounds such as 2-hydroxyethyl (meth)acrylate, 2-hydroxypropyl (meth)acrylate, o-hydroxystyrene, m-hydroxystyrene, p-hydroxystyrene, N-methylol(meth)acrylamide, 2-propenyl alcohol and 2-methyl-2-propenyl alcohol;

amide group-containing unsaturated compounds other than those described above such as (meth)acrylamide, crotonic acid amide and cinnamic acid amide;

carboxyl group-containing unsaturated compounds other than those described above such as mono[2-(meth)acryloyloxyethyl] succinate, mono[2-(meth)acryloyloxyethyl] phthalate, mono[2-(meth)acryloyloxyethyl] hexahydrophthalate and mono[2-(meth)acryloyloxyethyl] maleate, and the compounds (hereinafter referred to as the "acrylamide derivatives (iii)") represented by the following formula (3):

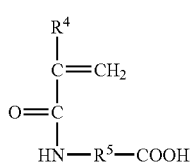

(3)

wherein in formula (3) $R^4$ represents a hydrogen atom or a monovalent organic group, and $R^5$ represents a divalent organic group.

In formula (3), examples of the monovalent organic group represented by $R^4$ may include the same groups as shown for the monovalent organic group having 1 to 12 carbon atoms represented by $R^1$ in the above formula (1), and examples of the divalent organic group represented by $R^5$ may also include the same groups as shown for the divalent organic group having 1 to 12 carbon atoms represented by $R^2$ in the above formula (1).

Specific examples of the acrylamide derivative (iii) may include: 2-(meth)acrylamido-2-methylpropanecarboxylic acid, 2-α-carboxyacrylamido-2-methylpropanecarboxylic acid, 2-α-(carboxymethyl)acrylamido-2-methylpropanecarboxylic acid, 2-α-(methoxycarbonyl)acrylamido-2-methylpropanecarboxylic acid, 2-α-(acetyloxy)acrylamido-2-methylpropanecarboxylic acid, 2-α-phenylacrylamido-2-methylpropanecarboxylic acid, 2-α-benzylacrylamido-2-methylpropanecarboxylic acid, 2-α-methoxyacrylamido-2-methylpropanecarboxylic acid, 2-α-(2-methoxyethyl)acrylamido-2-methylpropanecarboxylic acid, 2-α-cyclohexylacrylamido-2-methylpropanecarboxylic acid, 2-α-cyanoacrylamido-2-methylpropanecarboxylic acid and the like.

In the present invention, the other unsaturated monomers may be used each alone or as admixtures of two or more thereof.

In the present invention, the other unsaturated monomers are preferably (meth)acrylic acid alkyl ester compounds and particularly preferably methyl (meth)acrylate, ethyl (meth)acrylate, acrylamide derivatives (iii) and the like. As the acrylamide derivatives (iii), 2-(meth)acrylamido-2-methylpropanecarboxylic acid is particularly preferable.

The copolymerization for preparing the copolymer (α) can be carried out by means of appropriate methods such as radical polymerization, anionic polymerization, cationic polymerization and coordination polymerization in various polymerization modes such as mass polymerization, suspension polymerization, mass-suspension polymerization, emulsion polymerization, solution polymerization and precipitation polymerization. In these copolymerizations, the reaction components such as the individual monomers and the polymerization initiators may be added in an all-at-once manner, a divided manner or a continuous manner.

Additionally, the copolymer (α) may also be prepared by chemical post-processing of an appropriate precursor copolymer as the case may be.

Next, the salt of the copolymer (α) is a product obtained by at least partially neutralizing the sulfonic acid group in the repeating unit (1).

The salt of the copolymer (α) can be prepared, for example, by means of (a) a method in which the sulfonic acid group in the repeating unit (1) of the copolymer (α) is at least partially neutralized with an alkaline compound, or (b) a method in which the sulfonic acid group in the acrylamide derivative (i) is at least partially neutralized in advance with an alkaline compound, and is thereafter copolymerized with the acrylic acid ester derivative (ii) and other unsaturated monomers to be used as the case may be.

In the above-mentioned method (a), when there is present any other acidic group other than the sulfonic acid group in the repeating unit (1), the acidic group may be at least partially neutralized. Also, in the above-mentioned method (b), when the other unsaturated monomers have acidic groups, the acidic groups may be at least partially neutralized in advance.

In the present invention, the salt of the copolymer (α) is preferably prepared, on the basis of the above-mentioned method (a), for example, by adding the copolymer (α) to an aqueous solution of an alkaline compound to be mixed therein.

In the present invention, as the alkaline compound(s) to be used in the preparation of the salt of the copolymer (α), ammonia and/or an organic amine is preferably used.

Examples of the organic amine may include:

primary to tertiary monoamines such as methylamine, ethylamine, n-propylamine, n-butylamine, dimethylamine, diethylamine, di-n-propylamine, di-n-butylamine, trimethylamine, triethylamine, tri-n-propylamine, tri-n-butylamine, ethanolamine, aminomethylpropanol, 2-dimethylethanolamine, diethanolamine, triethanolamine, cyclohexylamine, pyrrole, pyrrolidine, oxazole, pyridine, piperidine, and morpholine; and primary to tertiary polyamines such as ethylenediamine, diethylenediamine, tetraethylenediamine, diethylenetriamine, tetraethylenetriamine, imidazole, imidazolidine, oxazole, pyrazine, piperazine and s-triazine.

Preferred among these organic amines are organic tertiary monoamines or organic tertiary polyamines.

The above-mentioned organic amines may be used each alone or as admixtures of two or more thereof.

In the present invention, particularly preferred as the alkaline compounds are ammonia and monovalent tertiary amines.

In the present invention, the degree of neutralization of the salt of the copolymer (α) is usually 5 to 100 mol % and preferably 30 to 90 mol % with respect to the sulfonic acid group in the repeating unit (1).

The (A) copolymer (salt) may have various structures such as a random copolymer, a block copolymer and a graft copolymer. In the case of the block copolymer, the repeating unit (1) and the repeating unit (2) may be concomitantly present in the same polymer block or may be present in different polymer blocks. Further, in the case of the graft copolymer, both of the repeating unit (1) and the repeating unit (2) may be concomitantly present in a trunk polymer and/or a branch polymer, or the repeating unit (1) may be present in either a trunk polymer or a branch polymer.

Examples of the preferred (A) copolymer (salt) in the present invention may include:

a copolymer (salt) of 2-(meth)acrylamido-2-methylpropanesulfonic acid and at least one of the fluoroalkyl(meth)acrylates each containing a fluoroalkyl group having 1 to 10 carbon atoms; and a copolymer (salt) of 2-(meth)acrylamido-2-methylpropanesulfonic acid, at least one of the fluoroalkyl(meth)acrylates each containing a fluoroalkyl group having 1 to 10 carbon atoms, and, as the other unsaturated monomer(s), at least one of the (meth)acrylic acid alkyl ester compounds and/or at least one of the acrylamide derivatives (iii).

Examples of the more preferable (A) copolymer (salt) in the present invention may include:

a copolymer (salt) of 2-(meth)acrylamido-2-methylpropanesulfonic acid and at least one selected from the group consisting of perfluoroalkyl (meth)acrylates each containing a perfluoroalkyl group having 1 to 10 carbon atoms, fluoroalkyl (meth)acrylates each containing a perfluoroalkyl group having 1 to 9 carbon atoms and bonded to the ester oxygen atom through a methylene group, and fluoroalkyl (meth)acrylates each containing a perfluoroalkyl group having 1 to 8 carbon atoms and bonded to the ester oxygen atom through an ethylene group; and a copolymer (salt) of 2-(meth)acrylamido-2-methylpropanesulfonic acid, at least one selected from the group consisting of perfluoroalkyl (meth)acrylates each containing a perfluoroalkyl group having 1 to 10 carbon atoms, fluoroalkyl (meth)acrylates each containing a perfluoroalkyl group having 1 to 9 carbon atoms and bonded to the ester oxygen atom through a methylene group, and fluoroalkyl (meth)acrylates each containing a perfluoroalkyl group having 1 to 8 carbon atoms and bonded to the ester oxygen atom through an ethylene group, and at least one of the above-mentioned (meth)acrylic acid alkyl ester compounds and/or at least one of the above-mentioned acrylamide derivatives (iii).

Examples of the particularly preferable (A) copolymer (salt) in the present invention may include:

a copolymer (salt) of 2-(meth)acrylamido-2-methylpropanesulfonic acid and at least one of perfluoroalkyl (meth)acrylates each containing a perfluoroalkyl group having 1 to 10 carbon atoms;

a copolymer (salt) of 2-(meth)acrylamido-2-methylpropanesulfonic acid and at least one of fluoroalkyl (meth)acrylates each containing a perfluoroalkyl group having 1 to 9 carbon atoms and bonded to the ester oxygen atom through a methylene group;

a copolymer (salt) of 2-(meth)acrylamido-2-methylpropanesulfonic acid and at least one of fluoroalkyl (meth)acrylates each containing a perfluoroalkyl group having 1 to 8 carbon atoms and bonded to the ester oxygen atom through an ethylene group;

a copolymer (salt) of 2-(meth)acrylamido-2-methylpropanesulfonic acid, at least one of the perfluoroalkyl (meth)acrylates each containing a perfluoroalkyl group having 1 to 10 carbon atoms and at least one of the fluoroalkyl (meth)acrylates each containing a perfluoroalkyl group having 1 to 9 carbon atoms and bonded to the ester oxygen atom through a methylene group;

a copolymer (salt) of 2-(meth)acrylamido-2-methylpropanesulfonic acid, at least one of the perfluoroalkyl (meth)acrylates each containing a perfluoroalkyl group having 1 to 10 carbon atoms and at least one of the fluoroalkyl (meth)acrylates each containing a perfluoroalkyl group having 1 to 8 carbon atoms and bonded to the ester oxygen atom through an ethylene group;

a copolymer (salt) of 2-(meth)acrylamido-2-methylpropanesulfonic acid, at least one of the fluoroalkyl (meth)acrylates each containing a perfluoroalkyl group having 1 to 9 carbon atoms and bonded to the ester oxygen atom through a methylene group, and at least one of the fluoroalkyl (meth)acrylates each containing a perfluoroalkyl group having 1 to 8 carbon atoms and bonded to the ester oxygen atom through an ethylene group;

a copolymer (salt) of 2-(meth)acrylamido-2-methylpropanesulfonic acid, at least one of the perfluoroalkyl (meth)acrylates each containing a perfluoroalkyl group having 1 to 10 carbon atoms, at least one of the fluoroalkyl (meth)acrylates each containing a perfluoroalkyl group having 1 to 9 carbon atoms and bonded to the ester oxygen atom through a methylene group, and at least one of the fluoroalkyl (meth)acrylates each containing a perfluoroalkyl group having 1 to 8 carbon atoms and bonded to the ester oxygen atom through an ethylene group;

a copolymer (salt) of 2-(meth)acrylamido-2-methylpropanesulfonic acid, at least one of the perfluoroalkyl (meth)acrylates each containing a perfluoroalkyl group having 1 to 10 carbon atoms, and at least one of the above-mentioned (meth)acrylic acid alkyl ester compounds and/or at least one of the above-mentioned acrylamide derivatives (iii);

a copolymer (salt) of 2-(meth)acrylamido-2-methylpropanesulfonic acid, at least one of the fluoroalkyl (meth)acrylates each containing a perfluoroalkyl group having 1 to 9 carbon atoms and bonded to the ester oxygen atom through a methylene group, and at least one of the above-mentioned (meth)acrylic acid alkyl ester compounds and/or at least one of the above-mentioned acrylamide derivatives (iii);

a copolymer (salt) of 2-(meth)acrylamido-2-methylpropanesulfonic acid, at least one of the fluoroalkyl (meth)acrylates each containing a perfluoroalkyl group having 1 to 8 carbon atoms and bonded to the ester oxygen atom through an ethylene group, and at least one of the above-mentioned (meth)acrylic acid alkyl ester compounds and/or at least one of the above-mentioned acrylamide derivatives (iii);

a copolymer (salt) of 2-(meth)acrylamido-2-methylpropanesulfonic acid, at least one of the perfluoroalkyl (meth)acrylates each containing a perfluoroalkyl group having 1 to 10 carbon atoms, at least one of the fluoroalkyl (meth)acrylates each containing a perfluoroalkyl group having 1 to 9 carbon atoms and bonded to the ester oxygen atom through a methylene group, and at least one of the above-mentioned (meth)acrylic acid alkyl ester compounds and/or at least one of the above-mentioned acrylamide derivatives (iii);

a copolymer (salt) of 2-(meth)acrylamido-2-methylpropanesulfonic acid, at least one of the perfluoroalkyl (meth)acrylates each containing a perfluoroalkyl group having 1 to 10 carbon atoms, at least one of the fluoroalkyl (meth)acrylates each containing a perfluoroalkyl group having 1 to 8 carbon atoms and bonded to the ester oxygen atom through an ethylene group, and at least one of the above-mentioned (meth)acrylic acid alkyl ester compounds and/or at least one of the above-mentioned acrylamide derivatives (iii);

a copolymer (salt) of 2-(meth)acrylamido-2-methylpropanesulfonic acid, at least one of the fluoroalkyl (meth)acrylates each containing a perfluoroalkyl group having 1 to 9 carbon atoms and bonded to the ester oxygen atom through a methylene group, at least one of the fluoroalkyl (meth)acrylates each containing a perfluoroalkyl group having 1 to 8 carbon atoms and bonded to the ester oxygen atom through an ethylene group, and at least one of the above-mentioned (meth)acrylic acid alkyl ester compounds and/or at least one of the above-mentioned acrylamide derivatives (iii);

a copolymer (salt) of 2-(meth)acrylamido-2-methylpropanesulfonic acid, at least one of the perfluoroalkyl (meth)acrylates each having a perfluoroalkyl group having 1 to 10 carbon atoms, at least one of the fluoroalkyl (meth)acrylates each containing a perfluoroalkyl group having 1 to 9 carbon atoms and bonded to the ester oxygen atom through a methylene group, at least one of the fluoroalkyl (meth)acrylates each containing a perfluoroalkyl group having 1 to 8 carbon atoms and bonded to the ester oxygen atom through an ethylene group, and at least one of the above-mentioned (meth)acrylic acid alkyl ester compounds and/or at least one of the above-mentioned acrylamide derivatives (iii).

When the (A) copolymer (salt) contains carbon-carbon unsaturated bonds, the (A) copolymer (salt) may also be used after hydrogenation. The hydrogenation rate for this case is usually 90% or less, preferably 70% or less and particularly preferably 50% or less.

The solubility of the (A) copolymer (salt) in water at 25° C. is preferably 0.1% by weight or more and particularly preferably 0.1 to 50% by weight. When the (A) copolymer (salt) have such a solubility in water, the (A) copolymer (salt) can have sufficient post-exposure exfoliation performance for water and a developer.

The polystyrene-reduced weight average molecular weight (hereinafter referred to as "Mw") of the (A) copolymer (salt) is usually 1,000 to 1,000,000, preferably 1,500 to 500,000 and particularly preferably 2,000 to 100,000. In this connection, when the Mw of the (A) copolymer (salt) is less than 1,000, the coatability and the film-forming ability tend to be degraded in the formation of the antireflection film. On the other hand, when the Mw of the (A) copolymer (salt) exceeds 1,000,000, the solubility in water or in the developer and the coatability tend to be degraded.

In the present invention, such (A) copolymers (salts) may be used each alone or as admixtures of two or more thereof.

—(B) Component—

The (B) component in the present invention includes a surfactant (hereinafter referred to as the "(B) surfactant") the surface tension (hereinafter referred to as the "surface tension [25/0.1]") of an aqueous solution of which at 25° C. and at a concentration of 0.1% by weight is 45 mN/m or less, preferably 10 to 45 mN/m and particularly preferably 15 to 43 mN/m.

The (B) surfactant is not particularly limited as long as the surface tension thereof satisfies the above-mentioned conditions; the (B) surfactant may be any of an anionic surfactant, a nonionic surfactant, a cationic surfactant and an amphoteric surfactant, and is particularly preferably a fluorine-containing surfactant.

Examples of the fluorine-containing anionic surfactant among the (B) surfactants may include, under the trade names: Surflon S-111 (surface tension [25/0.1]=17 mN/m), ditto S-112 (surface tension [25/0.1]=37.4 mN/m), ditto S-113 (surface tension [25/0.1]=15.8 mN/m), ditto S-121 (surface tension [25/0.1]=16.2 mN/m), ditto S-131 (surface tension [25/0.1]=15.5 mN/m), ditto S-132 (surface tension [25/0.1]=17 mN/m), (all these manufactured by SEIMI CHEMICAL Co., Ltd.); Ftergent 100 (surface tension [25/0.1]=21 mN/m), ditto 100C (surface tension [25/0.1]=33 mN/m), ditto 150 (surface tension [25/0.1]=20 mN/m), ditto 150CH (surface tension [25/0.1]=22 mN/m), ditto 300 (surface tension [25/0.1]=19 mN/m), ditto 501 (surface tension [25/0.1]=20 mN/m) and ditto A-K (surface tension [25/0.1]= 30 mN/m) (all these manufactured by Neos Co., Ltd.); and FFTOP EF-103 (surface tension [25/0.1]=26 mN/m), ditto EF-112 (surface tension [25/0.1]=12 mN/m), ditto EF-123A (surface tension [25/0.1]=15 mN/m), ditto EF-123B (surface tension [25/0.1]=17 mN/m), ditto EF-352 (surface tension [25/0.1]=25 mN/m) and ditto EF-802 (surface tension [25/ 0.1]=21.7 mN/m) (all these manufactured by JEMCO Inc.).

Examples of the fluorine-containing nonionic surfactant may include, under the trade names: Surflon S-141 (surface tension [25/0.1]=15.5 mN/m) and ditto S-145 (surface tension [25/0.1]=15.5 mN/m), ditto S-381 (surface tension [25/ 0.1]=17.5 mN/m) and ditto S-393 (surface tension [25/0.1]= 32.3 mN/m) (all these manufactured by SEIMI CHEMICAL Co., Ltd.); Ftergent 222F (surface tension [25/0.1]=36.0 mN/m), ditto 250 (surface tension [25/0.1]=26 mN/m), ditto 251 (surface tension [25/0.1]=21.0 mN/m), ditto FTX-209F (surface tension [25/0.1]=26 mN/m), ditto FTX-212M (surface tension [25/0.1]=21 mN/m), ditto FTX-213F (surface tension [25/0.1]=27 mN/m), ditto FTX-233F (surface tension [25/0.1]=24 mN/m) and ditto FTX-245F (surface tension [25/0.1]=28 mN/m) (all these manufactured by Neos Co., Ltd.); and FFTOP EF-121 (surface tension [25/0.1]=18 mN/m), ditto EF-122A (surface tension [25/0.1]= 26 mN/m), ditto EF-122B (surface tension [25/0.1]=23 mN/m), ditto EF-122C (surface tension [25/0.1]=16 mN/m), ditto EF-352 (surface tension [25/0.1]=25.0 mN/m), ditto EF-802 (surface tension [25/0.1]=21.7 mN/m) (all these manufactured by JEMCO Inc.).

Examples of the fluorine-containing cationic surfactant may include, under the trade names: Surflon S-121 (surface tension [25/0.1]=16.2 mN/m) (manufactured by SEIMI CHEMICAL Co., Ltd.); and Ftergent 300 (surface tension [25/0.1]=19.0 mN/m) and ditto 310 (surface tension [25/0.1]= 18.0 mN/m) (both manufactured by Neos Co., Ltd.).

Examples of the fluorine-containing amphoteric surfactant may include, under the trade names: Surflon S-131 (surface tension [25/0.1]=15.5 mN/m) and ditto S-132 (surface tension [25/0.1]=17 mN/m) (both manufactured by SEIMI CHEMICAL Co., Ltd.); Ftergent 400S (surface tension [25/0.1]=21 mN/m) (manufactured by Neos Co., Ltd.); and FFTOP EF-132 (surface tension [25/0.1]=10 mN/m) (manufactured by JEMCO Inc.).

Examples of the surfactants other than the fluorine-containing surfactants may include, under the trade names: Surfynol 104, ditto 104E, ditto 420, ditto 440, ditto 465, ditto SE, ditto SE-F, ditto 504, ditto 2502, ditto DF58, ditto CT111, ditto GA, ditto E104, ditto PD-001, ditto PD-002W, ditto PD-004, ditto EXP4001, ditto EXP4051 and Dynol 604 (all these manufactured by Nissin Chemical Industry Co., Ltd.); and Fluorad FC-4430 (manufactured by Sumitomo 3M Ltd.).

In the present invention, the amount of the (B) surfactant to be used is usually 0.001 to 50 parts by weight, preferably 0.01 to 40 parts by weight and particularly preferably 0.1 to 30 parts by weight per 100 parts by weight of the (A) copolymer (salt). In this connection, when the amount of the (B) surfactant used is less than 0.001 part by weight, satisfactory antireflection film reduced in the amount of microbubbles may becomes hardly obtainable. On the other hand, when the amount of the (B) surfactant used exceeds 50 parts by weight, the resist may be dissolved.

—Additives—

Various additives may be mixed in the antireflection film-forming composition of the present invention, as long as the additives do not impair the expected advantageous effects of the present invention.

Examples of the above-mentioned additives may include: a fluoroalkylsulfonic acid having 4 to 12 carbon atoms or a salt thereof and/or a fluoroalkylcarboxylic acid having 4 to 12 carbon atoms or a salt thereof (hereinafter these compounds will be collectively referred to as the "(C) additive"). The (C) additive is a component having an action to further improve the effect of reducing the standing-wave effect of the antireflection film.

Each of the above-mentioned fluoroalkylsulfonic acid and fluoroalkylcarboxylic acid may be a straight chain compound or a branched compound; each of the fluoroalkyl groups of these compounds may be either a hydrofluoroalkyl group or a perfluoroalkyl group.

Examples of each of the fluoroalkyl groups in the above-mentioned fluoroalkylsulfonic acid and the above-mentioned fluoroalkylcarboxylic acid may include the following groups, in addition to the same groups as the fluoroalkyl groups having 4 to 10 carbon atoms among the groups shown for Rf in the above formula (2):

a 1,1,2,2,3,3,4,4,5,5-decafluoropentyl group;
a 1,1,2,2,3,3,4,4,5,5,6,6-dodecafluorohexyl group;
a 1,1,2,2,3,3,4,4,5,5,6,6,7,7-tetradecafluoroheptyl group;
a 1,1,2,2,3,3,4,4,5,5,6,6,7,7,8,8-hexadecafluorooctyl group;
a 1,1,2,2,3,3,4,4,5,5,6,6,7,7,8,8,9,9-octadecafluorononyl group;
a 1,1,2,2,3,3,4,4,5,5,6,6,7,7,8,8,9,9,10,10-eicosafluorodecyl group;
a 2-(perfluorononyl)ethyl group, a 2,2,3,3,4,4,5,5,6,6,7,7,8,8,9,9,10,10,11,11-eicosafluoroundecyl group, a (perfluorodecyl)methyl group, a 1,1,2,2,3,3,4,4,5,5,6,6,7,7,8,8,9,9,10,10,11,11-docosafluoroundecyl group and a perfluoroundecyl group; and
a 2-(perfluorodecyl)ethyl group, a 2,2,3,3,4,4,5,5,6,6,7,7,8,8,9,9,10,10,11,11,12,12-docosafluorodecyl group, a (perfluoroundecyl)methyl group, a 1,1,2,2,3,3,4,4,5,5,6,6,7,7,8,8,9,9,10,10,11,11,12,12-tetracosafluorododecyl group, and a perfluorododecyl group.

Specific examples of the fluoroalkylsulfonic acid may include:

2-(heptafluoropropyl)ethanesulfonic acid, 1,1,2,2,3,3,4,4,5,5-decafluoropentanesulfonic acid, perfluoropentanesulfonic acid;

2-(nonafluorobutyl)ethanesulfonic acid, 1,1,2,2,3,3,4,4,5,5,6,6-dodecafluorohexanesulfonic acid, perfluorohexanesulfonic acid;

2-(perfluoropentyl)ethanesulfonic acid, 1,1,2,2,3,3,4,4,5,5,6,6,7,7-tetradecafluoroheptanesulfonic acid, perfluoroheptanesulfonic acid;

2-(perfluorohexyl)ethanesulfonic acid, 1,1,2,2,3,3,4,4,5,5,6,6,7,7,8,8-hexadecafluorooctanesulfonic acid, perfluorooctanesulfonic acid;

2-(perfluoroheptyl)ethanesulfonic acid, 1,1,2,2,3,3,4,4,5,5,6,6,7,7,8,8,9,9-octadecafluorononanesulfonic acid, perfluorononanesulfonic acid;

2-(perfluorooctyl)ethanesulfonic acid, 1,1,2,2,3,3,4,4,5,5,6,6,7,7,8,8,9,9,10,10-eicosafluorodecanesulfonic acid, perfluorodecanesulfonic acid;

2-(perfluorononyl)ethanesulfonic acid, 1,1,2,2,3,3,4,4,5,5,6,6,7,7,8,8,9,9,10,10,11,11-docosafluoroundecanesulfonic acid, perfluoroundecanesulfonic acid;

2-(perfluorodecyl)ethanesulfonic acid, 1,1,2,2,3,3,4,4,5,5,6,6,7,7,8,8,9,9,10,10,11,11,12,12-tetracosafluorododecanesulfonic acid and perfluorododecanesulfonic acid.

Additionally, specific examples of the fluoroalkylcarboxylic acid may include:

2-(heptafluoropropyl)ethanecarboxylic acid, 1,1,2,2,3,3,4,4,5,5-decafluoropentanecarboxylic acid, perfluoropentanecarboxylic acid;

2-(nonafluorobutyl)ethanecarboxylic acid, 1,1,2,2,3,3,4,4,5,5,6,6-dodecafluorohexanecarboxylic acid, perfluorohexanecarboxylic acid;

2-(perfluoropentyl)ethanecarboxylic acid, 1,1,2,2,3,3,4,4,5,5,6,6,7,7-tetradecafluoroheptanecarboxylic acid, perfluoroheptanecarboxylic acid;

2-(perfluorohexyl)ethanecarboxylic acid, 1,1,2,2,3,3,4,4,5,5,6,6,7,7,8,8-hexadecafluorooctanecarboxylic acid, perfluorooctanecarboxylic acid;

2-(perfluoroheptyl)ethanecarboxylic acid, 1,1,2,2,3,3,4,4,5,5,6,6,7,7,8,8,9,9-octadecafluorononanecarboxylic acid, perfluorononanecarboxylic acid;

2-(perfluorooctyl)ethanecarboxylic acid, 1,1,2,2,3,3,4,4,5,5,6,6,7,7,8,8,9,9,10,10-eicosafluorodecanecarboxylic acid, and perfluorodecanecarboxylic acid.

Among these fluoroalkylsulfonic acids and fluoroalkylcarboxylic acids, the compounds each containing a fluoroalkyl group having 6 to 12 carbon atoms are preferable, and the compounds each containing a fluoroalkyl group having 7 to 12 carbon atoms are particularly preferable.

Examples of the salts of the above-mentioned fluoroalkyl-sulfonic acids and the salts of the above-mentioned fluoroalkylcarboxylic acids may include the lithium salts, the sodium salts, the potassium salts and the ammonium salts thereof.

Preferred among these salts are the sodium salts, the potassium salts, the ammonium salts and the like.

The above-mentioned (C) additives may be used each alone or as admixtures of two or more thereof.

In the present invention, the mixing amount of the (C) additive is preferably 0.001 to 100 parts by weight and particularly preferably 0.01 to 80 parts by weight per 100 parts by weight of the (B) surfactant. In this connection, when the mixing amount of the (C) additive is less than 0.001 part by weight, the action to improve the standing-wave effect tends to be degraded. On the other hand, when the mixing amount of the (C) additive exceeds 100 parts by weight, the surface tension-decreasing ability due to the (B) surfactant tends to be impaired, and the storage stability of the composition tends to be degraded.

Further, examples of additives other than the above-mentioned additives may include other water-soluble polymers, alkali-soluble polymers and acid generators.

Examples of the above-mentioned water-soluble polymers and alkali-soluble polymers may include: polyvinyl alcohol, polymethyl vinyl ether, polyethyl vinyl ether, polyethylene glycol, ammonium polyacrylate, sodium polyacrylate, polyhydroxystyrene or the derivatives thereof, styrene-maleic anhydride copolymer or the hydrolysate thereof, polyvinyl hydroxybenzoate, and carboxyl group-containing (meth)acrylic resins.

These other water-soluble polymers or alkali-soluble polymers may be used each alone or as admixtures of two or more thereof.

The mixing amount of the other water-soluble polymer(s) and/or the other alkali-soluble polymer(s) is usually 200 parts by weight or less, and preferably 100 parts by weight or less per 100 parts by weight of the (A) copolymer (salt).

The above-mentioned acid generator is a component having an action to improve the pattern profile, the resolution, the developability and the like of the resist.

Examples of such an acid generator may include onium salts, haloalkyl group-containing compounds, o-quinone diazide compounds, nitrobenzyl compounds, sulfonic acid ester compounds, sulfone compounds and the like.

Examples of the above-mentioned onium salts may include the compounds represented by the following formula (4), (5) or (6):

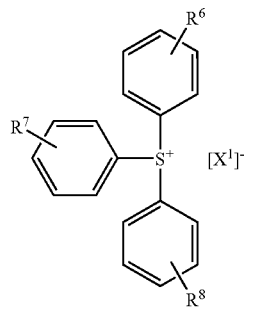
(4)

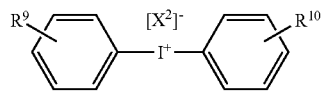
(5)

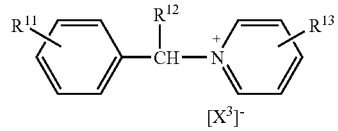
(6)

wherein in formulas (4) to (6) $R^6$, $R^7$, $R^8$, $R^9$, $R^{10}$, $R^{11}$, $R^{12}$ and $R^{13}$ each independently represent a hydrogen atom, an amino group, a nitro group, a cyano group, an alkyl group or an alkoxy group; and $X^1$, $X^2$ and $X^3$ each independently represent $SbF_6$, $AsF_6$, $PF_6$, $BF_4$, $ClO_4$, $CF_3CO_2$, $CF_3SO_3$,

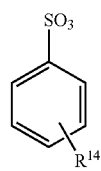

wherein $R^{14}$ is a hydrogen atom, an amino group, a nitro group, a cyano group, an alkyl group or an alkoxy group,

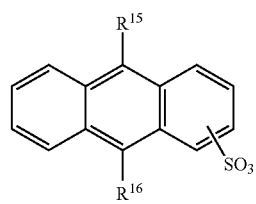

wherein $R^{15}$ and $R^{16}$ each are independently an alkoxy group,

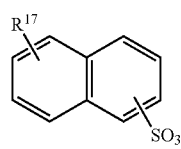

wherein $R^{17}$ is a hydrogen atom, an amino group, an anilino group, an alkyl group or an alkoxy group, or

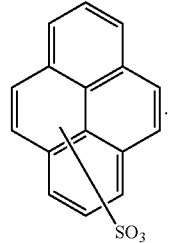

Examples of the above-mentioned haloalkyl group-containing compounds may include the compounds represented by the following formula (7) or (8):

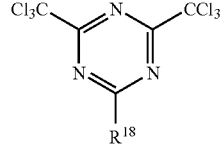
(7)

wherein in formula (7) $R^{18}$ represents a trichloromethyl group, a phenyl group, a methoxyphenyl group a naphthyl group or a methoxynaphthyl group, and (8)

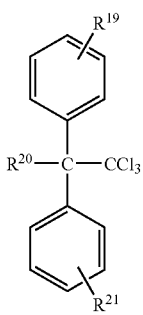

wherein in formula (8) $R^{19}$, $R^{20}$ and $R^{21}$ each are independently a hydrogen atom, a halogen atom, a methyl group, a methoxy group or a hydroxy group.

Examples of the above-mentioned o-quinone diazide compounds may include the compounds represented by the following formula (9) or (10):

(9)

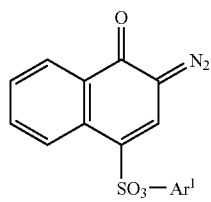

wherein in formula (9) $Ar^1$ represents

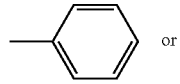

or

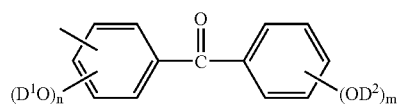

wherein $D^1$ and $D^2$ each are independently a hydrogen atom or a 1,2-naphthoquinone diazide-4-sulfonyl group, n and m each are an integer of 0 to 3 (n and m are not zero at the same time), and two or more $D^1$s or $D^2$s may be the same or different from each other; and (10)

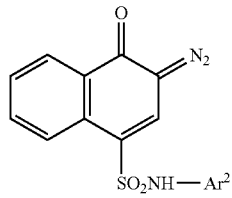

wherein in formula (10) $Ar^2$ represents

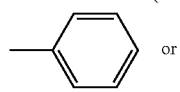

or

-continued

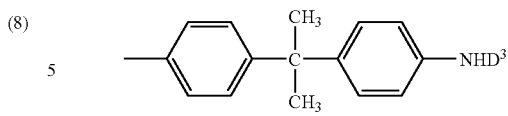

wherein $D^3$ is a hydrogen atom or a 1,2-naphthoquinone diazide-4-sulfonyl group.

Examples of the above-mentioned nitrobenzyl compounds may include the compounds represented by the following formula (11):

(11)

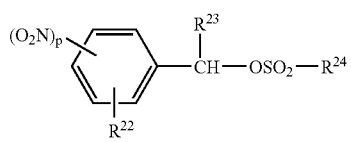

wherein in formula (11) p is an integer of 1 to 3, $R^{22}$ represents an alkyl group, $R^{23}$ represents a hydrogen atom or an alkyl group, and $R^{24}$ represents

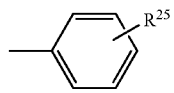

wherein $R^{25}$ is a hydrogen atom or an alkyl group,

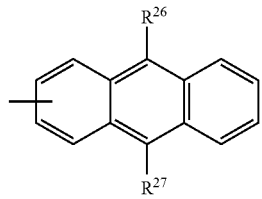

wherein $R^{26}$ and $R^{27}$ each are independently an alkoxy group, or

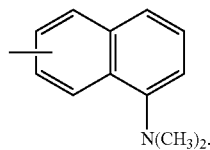

Examples of the above-mentioned sulfonic acid ester compounds may include the compounds represented by the following formula (12), (13), (14) or (15):

(12)

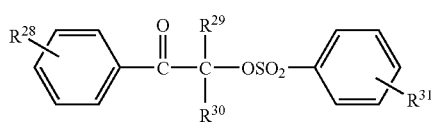

wherein in formula (12) $R^{28}$ and $R^{31}$ each independently represent a hydrogen atom or an alkyl group, and $R^{29}$ and $R^{30}$ each independently represent a hydrogen atom, an alkyl group or an aryl group,

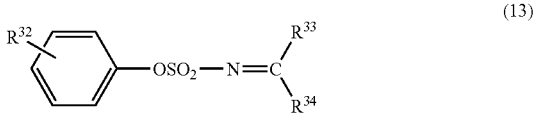

wherein in formula (13) $R^{32}$ represents a hydrogen atom or an alkyl group, $R^{33}$ and $R^{34}$ each independently represent an alkyl group or an aryl group, or $R^{33}$ and $R^{34}$ represent a cyclic structural unit formed by the mutual bonding thereof,

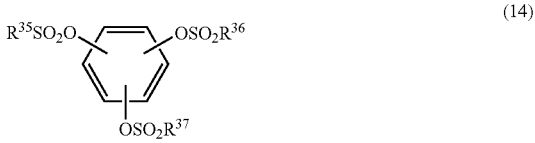

wherein in formula (14) $R^{35}$, $R^{36}$ and $R^{37}$ each independently represent a methyl group, a trifluoromethyl group, a trichloromethyl group, a phenyl group, a tolyl group, a cyanophenyl group, a trichlorophenyl group or a (trifluoromethyl)phenyl group, and

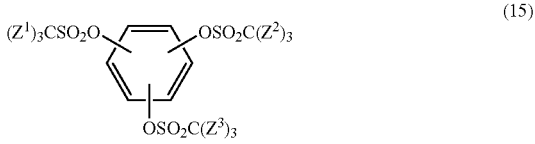

wherein in formula (15) $Z^1$, $Z^2$ and $Z^3$ each independently represent a fluorine atom, a chlorine atom, a hydrogen atom, an alkyl group or an aryl group, and in any of the three sets composed of three $Z^1$s, three $Z^2$s and three $Z^3$s, respectively, the three members in each set may be the same or different from each other.

Examples of the above-mentioned sulfone compounds may include the compounds represented by the following formula (16):

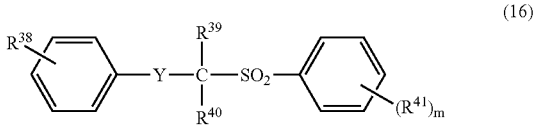

wherein in formula (16) Y represents —CO— or —SO$_2$—, $R^{38}$, $R^{39}$, $R^{40}$ and $R^{41}$ each independently represent a halogen atom or an alkyl group, and m is an integer of 0 to 3; when two or more $R^{41}$s are present, they may be the same or different from each other.

Particularly preferred among these acid generators are onium salts.

The above-mentioned acid generators may be used each alone or as admixtures of two or more thereof.

The mixing amount of the acid generator is usually 20 parts by weight or less and preferably 10 parts by weight or less per 100 parts by weight of the total amount of the polymer components in the antireflection film-forming composition. In this connection, when the amount of the acid generator used exceeds 20 parts by weight, the developability tends to be degraded.

Additionally, examples of the additives other than those described above may include a light absorber, a storage stabilizer, a defoaming agent, an adhesion aid, an antiseptic agent and a pigment.

Preferable Compositions of the Antireflection Film-forming Composition

As described above in detail, the antireflection film-forming composition of the present invention includes as the essential constituent components the (A) copolymer (salt) and the (B) surfactant, and includes if needed the above-mentioned various additives. In this connection, more specifically the preferable compositions of the above-mentioned composition may include:

(a1) an antireflection film-forming composition including at least one of the (A) copolymers (salts) each composed of a copolymer (salt) of 2-(meth)acrylamido-2-methylpropanesulfonic acid and at least one of the fluoroalkyl(meth) acrylates each containing a fluoroalkyl group having 1 to 10 carbon atoms; and at least one of the (B) surfactants selected from the group consisting of FFTOP EF112, ditto EF-121, ditto EF-122A, ditto EF-122B, ditto EF-122C, ditto EF-352, ditto EF-802, Surflon S-111, ditto S-112, ditto S-113, ditto S-121, ditto S-131, ditto S-132, ditto S-141, ditto S-145, Ftergent 100, ditto 222F, ditto 250, ditto 251, ditto 300, Surfynol 104, ditto 420, ditto 440 and ditto 465; and (a2) an antireflection film-forming composition including at least one of the (A) copolymers (salts) each composed of a copolymer (salt) of 2-(meth)acrylamido-2-methylpropanesulfonic acid, at least one of the fluoroalkyl(meth) acrylates each containing a fluoroalkyl group having 1 to 10 carbon atoms, and, as the other unsaturated monomer(s), at least one of the (meth)acrylic acid alkyl ester compounds and/or at least one of the acrylamide derivatives (iii); and at least one of the (B) surfactants selected from the group consisting of FFTOP EF112, ditto EF-121, ditto EF-122A, ditto EF-122B, ditto EF-122C, ditto EF-352, ditto EF-802, Surflon S-111, ditto S-112, ditto S-113, ditto S-121, ditto S-131, ditto S-132, ditto S-141, ditto S-145, Ftergent 100, ditto 222F, ditto 250, ditto 251, ditto 300, Surfynol 104, ditto 420, ditto 440 and ditto 465; and as more preferable combinations, (b1) an antireflection film-forming composition including at least one of the (A) copolymers (salts) each composed of a copolymer (salt) of 2-(meth)acrylamido-2-methylpropanesulfonic acid and at least one selected from the group consisting of perfluoroalkyl (meth)acrylates each containing a perfluoroalkyl group having 1 to 10 carbon atoms, fluoroalkyl (meth)acrylates each containing a perfluoroalkyl group having 1 to 9 carbon atoms and bonded to the ester oxygen atom through a methylene group and fluoroalkyl (meth)acrylates each containing a perfluoroalkyl group having 1 to 8 carbon atoms and bonded to the ester oxygen atom through an ethylene group; and at least one of the (B) surfactants selected from the group consisting of FFTOP EF112, ditto EF-121, ditto EF-122A, ditto EF-122B, ditto EF-122C, ditto EF-352, ditto EF-802, Surflon S-111, ditto S-112, ditto S-113, ditto S-121, ditto S-131, ditto S-132, ditto S-141, ditto S-145, Ftergent 100, ditto 222F, ditto 250, ditto 251, ditto 300, Surfynol 104, ditto 420, ditto 440 and ditto 465;

(b2) an antireflection film-forming composition including at least one of the (A) copolymers (salts) each composed of a copolymer (salt) of 2-(meth)acrylamido-2-methylpropanesulfonic acid and at least one selected from the group consisting of perfluoroalkyl (meth)acrylates each containing a perfluoroalkyl group having 1 to 10 carbon atoms, fluoroalkyl (meth)acrylates each containing a perfluoroalkyl group having 1 to 9 carbon atoms and bonded to the ester oxygen atom through a methylene group, and fluoroalkyl (meth)acrylates each containing a perfluoroalkyl group having 1 to 8 carbon atoms and bonded to the ester oxygen atom through an ethylene group, and at least one of the above-mentioned (meth)acrylic acid alkyl ester compounds and/or at least one of the above-mentioned acrylamide derivatives (iii); and at least one of the (B) surfactants selected from the group consisting of FFTOP EF112, ditto EF-121, ditto EF-122A, ditto EF-122B, ditto EF-122C, ditto EF-352, ditto EF-802, Surflon S-111, ditto S-112, ditto S-113, ditto S-121, ditto S-131, ditto S-132, ditto S-141, ditto S-145, Ftergent 100, ditto 222F, ditto 250, ditto 251, ditto 300, Surfynol 104, ditto 420, ditto 440 and ditto 465.

In the present invention, when an antireflection film is formed of the antireflection film-forming composition, a predetermined amount of the composition is dissolved in a solvent so as to give, for example, a solid content concentration of 2 to 10% by weight, and thereafter the solution thus obtained is filtered with a filter having, for example, a pore size of approximately 0.2 μm to prepare a solution (hereinafter referred to as the "an antireflection film-forming composition solution"), and the antireflection film-forming composition solution is applied to the resist coating film by means of an appropriate coating method such as rotational coating, cast coating and roll coating.

Examples of the solvent to be used for preparation of the antireflection film-forming composition solution may include the following solvents capable of dissolving the individual components constituting the above-mentioned composition:

water;
monovalent alcohols such as methanol, ethanol, 1-propanol, 2-propanol, 1-butanol, 2-butanol, t-butanol, 1-pentanol, 2-pentanol, 3-pentanol, 2-methyl-1-butanol, 3-methyl-1-butanol, 2-methyl-2-butanol, 3-methyl-2-butanol, 1-hexanol, 2-hexanol, 3-hexanol, 2-methyl-1-pentanol, 3-methyl-1-pentanol, 4-methyl-1-pentanol, 2-methyl-2-pentanol, 3-methyl-2-pentanol, 4-methyl-2-pentanol, 2-methyl-3-pentanol, 3-methyl-3-pentanol, cyclohexanol, 1-heptanol, 2-heptanol, 3-heptanol, 4,4-dimethyl-2-pentanol, 2,2-dimethyl-3-pentanol, 2,3-dimethyl-3pentanol, 2,4-dimethyl-3-pentanol, 3-ethyl-3-pentanol, 5-methyl-1-hexanol, 2-methyl-2-hexanol, 5-methyl-2-hexanol, 2-methyl-3-hexanol, 1-octanol, 2-octanol, 3-octanol, 2,4,4-trimethyl-1-pentanol, 2-n-propyl-1-pentanol, 2-ethyl-1-hexanol, 6-methyl-2-heptanol, 4-methyl-3-heptanol, 1-nonanol, 2-nonanol, 3-nonanol, 3-ethyl-2,2-dimethyl-1-pentanol, 3,5,5-trimethyl-1-hexanol, 2,6-dimethyl-4-heptanol, 1-decanol, 2-decanol, 3-decanol, 4-decanol, 3,7-dimethyl-1-octanol and 3,7-dimethyl-3-octanol; and additionally,
ethylene glycol monomethyl ether acetate, ethylene glycol monoethyl ether acetate, diethylene glycol monomethyl ether, diethylene glycol monoethyl ether, diethylene glycol monobutyl ether, propylene glycol methyl ether acetate, propylene glycol ethyl ether acetate, propylene glycol propyl ether acetate, methyl ethyl ketone, cyclohexanone, methyl 2-hydroxypropionate, ethyl 2-hydroxypropionate, ethyl 2-hydroxy-2-methylpropionate, methyl 3-methoxypropionate, ethyl 3-ethoxypropionate, ethyl ethoxyacetate, ethyl oxyacetate, methyl 2-hydroxy-3-methylbutyrate, 3-methyl-3-methoxybutylacetate, 3-methyl-3-methoxybutylpropionate, 3-methyl-3-methoxybutylbutyrate, ethyl acetate, butyl acetate, methyl 3-methoxypropionate, ethyl pyruvate, benzyl ethyl ether, dihexyl ether, acetonylacetone, isophorone, caproic acid, caprylic acid, benzyl acetate, ethyl benzoate, diethyl oxalate, diethyl maleate, γ-butyrolactone, ethylene carbonate, propylene carbonate, and ethylene glycol monophenyl ether acetate.

These solvents are used each alone or as admixtures of two or more thereof.

Preferred among the above-mentioned solvents are the solvents that contain water and/or monovalent alcohol. In such a solvent containing water and/or monovalent alcohol, the content of the water and/or the monovalent alcohol is usually 10 to 100% by weight and preferably 50 to 100% by weight.

Layered Product

The layered product of the present invention is fabricated by forming on a resist coating film an antireflection film made of the antireflection film-forming composition of the present invention.

The layered product of the present invention may be fabricated, for example, by means of the procedures to be described on a below-described method of forming a resist pattern.

In the layered product of the present invention, the thickness of the antireflection film is varied according to the wavelength of the radiation to be used for the resist pattern formation, the refractive index of the antireflection film and the like; the thickness of the antireflection film is preferably selected within such a range that the thickness of the antireflection film is $\lambda/4m$ times an odd number ($\lambda$ represents the wavelength of the radiation, and m represents the refractive index of the antireflection film), and preferably $\lambda/4m$ times one or three.

Method of Forming a Resist Pattern

The method of forming a resist pattern of the present invention is a method in which a resist coating film is formed on a substrate, and the resist coating film is irradiated with radiation (hereinafter referred to as "exposure") and successively developed to form a resist pattern, the method being characterized by including the steps in which on the above-mentioned resist coating film, an antireflection film is beforehand formed of the antireflection film-forming composition of the present invention, and thereafter the above-mentioned resist coating film is exposed in a predetermined pattern and then developed to remove the above-mentioned antireflection film.

Examples of the resist to be used for the method of forming a resist pattern of the present invention may include a positive tone resist such as a novolac-type resist containing a quinonediazide compound, and a chemically amplified positive tone or negative tone resist.

When a resist coating film is formed of such a resist, the resist is, according to need, dissolved in an appropriate solvent so as to give, for example, a solid content concentration of 5 to 50% by weight, and thereafter the solution thus obtained is filtered with a filter having, for example, a pore size of approximately 0.2 μm to prepare a resist solution, the resist solution is applied to a substrate such as a silicon wafer or an aluminum-coated wafer by means of an appropriate coating method such as rotational coating, cast coating and roll coating, and the substrate thus coated is usually prebaked to evaporate the solvent to form a resist coating film. In this connection, when a commercially available resist solution is used, the solution can be used as it is for forming a resist pattern.

Examples of the solvents to be used for the above-mentioned resist solution may include the same solvents as shown for the above-mentioned antireflection film-forming composition solution.

Next, the antireflection film-forming composition solution is applied to the resist coating film, and is usually baked again to form an antireflection film. In this connection, it is to be noted that the closer the thickness of the antireflection film to $\lambda/4m$ times an odd number ($\lambda$ represents the wavelength of the radiation, and m represents the refractive index of the antireflection film), the higher the antireflection effect on the upper interface of the resist coating film becomes.

When the antireflection film-forming composition solution is applied to the resist coating film, an appropriate coating method such as rotational coating, cast coating and roll coating may be adopted.

It is to be noted that in the present invention, either of the prebaking processing after the application of the resist solution and the baking processing after the application of the antireflection film-forming composition solution may be omitted for the purpose of simplifying the steps.

Thereafter, a partial exposure is carried out to form a predetermined pattern profile. The radiation to be used for such an exposure is selected, according to the resist to be used and the combination of the resist and the basic material blocking antireflection film, from various radiations such as visible rays, ultraviolet rays such as the g-line and the i-line, deep ultraviolet rays such as ArF excimer laser or KrF excimer laser, X-rays such as synchrotron radiation and charged particle rays such as an electron beam. In this connection, for the purpose of improving the resolution, the pattern profile, the developability and the like of the resist, it is preferable to carry out post-exposure baking. The temperature for the post-exposure baking is appropriately regulated according to the resist to be used, and is usually approximately 50 to 200° C.

Thereafter, the resist coating film is developed to form a desired resist pattern.

The developer to be used in the development can be appropriately selected according to the resist to be used, and an alkaline developer is preferable. When the development is carried out with an alkaline developer, usually cleaning is carried out after development.

In the method of forming a resist pattern of the present invention, the use of an alkaline developer as the developer makes it unnecessary to separately arrange a step for removing the antireflection film, and results in easy removal of the antireflection film along with the resist coating film during development, and also during cleaning when cleaning is made after development; this is a significant feature of the present invention.

Examples of the above-mentioned alkaline developer may include alkaline aqueous solutions in which are dissolved the alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5,4,0]-7-undecene, and 1,5-diazabicyclo-[4,3,0]-5-nonene.

These alkaline developers may also be added with water-soluble organic solvents such as alcohols including methanol and ethanol, and surfactants, in appropriate amounts.

When development is carried out with the above-mentioned alkaline developer, usually cleaning with water is carried out after development.

As described above, detailed description has been made on the individual components constituting the antireflection film-forming composition, the interrelations between these components, and the methods of forming a layered product and a resist pattern of the present invention; however, the present invention may adopt various variations other than the above descriptions provided that the gist of the present invention is not exceeded.

DESCRIPTION OF THE PREFERRED EMBODIMENTS

Figure 1:
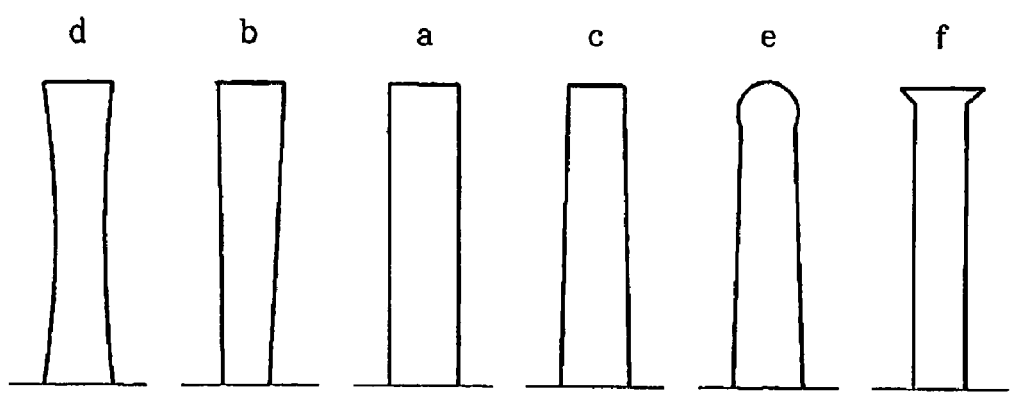
FIG. 1 is a view illustrating the cross-sectional shapes of patterns and the evaluation standards for individual pattern profiles.

Hereinafter, the embodiments of the present invention will be described more specifically with reference to Examples and Comparative Examples. However, the present invention is not limited to these Examples. It is to be noted that parts and % are based on weight unless otherwise specified.

The resist used in each of Examples and Comparative Examples is a chemically amplified positive-tone resist M20G for Krf excimer laser (trade name, manufactured by JSR Corp.).

The formation of a resist pattern and the performance evaluation of an antireflection film were carried out in the following manner.

Formation of a Resist Pattern

The above-mentioned resist was applied by rotational coating to a silicon wafer of 8 inches in diameter, and then prebaked on a hot plate at 140° C. for 90 seconds to form a resist coating film of 0.6 μm in thickness. Thereafter, to the resist coating film, each of the antireflection film-forming composition solutions was applied by rotational coating so as for the film thickness of the formed antireflection film to fall within a range from 35 to 50 nm. Thereafter, each of the formed antireflection films was subjected to an exposure for a predetermined period of time by using a stepper NSRS203B (wavelength: 248 nm) manufactured by NIKON CORP. Immediately after exposure, each of the antireflection films was subjected to a post-exposure baking on a hot plate at 140° C. for 90 seconds, then developed at 25° C. for 1 minute with a 2.38% aqueous solution of tetramethylammonium hydroxide, then cleaned with water and dried to form a resist pattern.

Performance Evaluation of the Antireflection Films

—Resolution—

The dimension of the resolved smallest resist pattern was measured with a scanning electron microscope and was defined as the resolution.

—Developability—

The degree of scum and the degree of undeveloped area due to the residuals of the antireflection film or the resist coating film were examined with a scanning electron microscope, and the cases where neither scum nor undeveloped are was identified were evaluated to be good in developability.

Pattern Profile and Basic Material Blocking Effect:

The cross-sectional shapes of the resist patterns were observed with a scanning electron microscope, and the shapes (a), (b) and (c) among the cross-sectional shapes shown in FIG. 1 were evaluated to be good. When such an eave as shown in the shapes (d), (e) and (f) in FIG. 1 was not observed on the top of the pattern, the blocking effect against the basic materials in the ambient atmosphere was evaluated to be good.

—Standing-wave Effect—

Resist coating films were formed on silicon wafers of 6 inches in diameter to give the film thickness values successively different by 0.01 μm falling within a range from 1.00 to 1.15 μm; thereafter, the antireflection films were formed in the above-mentioned manner, and each of the wafers was subjected to exposure with a different dose of radiation for each wafer with the above-mentioned reduced projection exposure system, and then the post-exposure baking and development were carried out as described above to form a resist pattern.

Thereafter, each of the thus obtained wafers was observed with an optical microscope, and the minimum exposure dose amount with which the remaining film was made to vanish within a 100 μm wide space portion was determined, and the minimum exposure dose amount thus obtained was defined as the sensitivity for each film thickness. The maximum value and the minimum value of the thus obtained sensitivities were represented by Emax and Emin, respectively; the S value (sensitivity variation accompanying the film thickness fluctuation, namely, dimensional fluctuation) defined by the following formula was defined as the standing-wave effect index; and when S was smaller than 10, the standing-wave effect was evaluated to be good.

$S=(Emax-Emin)\times 100/Emax$

—Microbubbles—

After a resist coating film was formed on a silicon wafer, an antireflection film was formed in the above-mentioned manner. Then, the antireflection film was observed with a defect inspection apparatus KLA2351 manufactured by KLA-Tencor Corp. to evaluate the presence/absence of microbubbles each having a maximum dimension of 0.5 μm or more.

—Defects After Development—

After a resist pattern was formed on a silicon wafer in the above-mentioned manner, the presence/absence of the defects, on the antireflection film after development, due to microbubbles was observed with the defect inspection apparatus KLA2351 manufactured by KLA-Tencor Corp., and the absence of defects was marked with a symbol "o" for evaluation and the presence of defects was marked with a symbol "x" for evaluation.

In each of Examples and Comparative Examples, the (A) copolymer (salt) was prepared according to any of the below-described synthesis examples 1 to 9, and the physical properties of each of the (A) copolymers (salts) were evaluated in the following manner.

Evaluation of the Physical Properties of the (A) Copolymer (Salt)

—Mw—

The Mw values were measured by gel permeation chromatography relative to monodispersed polystyrene standards by using GPC columns (G2000H$_{XL}$: two columns, G3000H$_{XL}$: one column, G4000H$_{XL}$: one column) manufactured by Tosoh Corp. under the analysis conditions that the flow rate was 1.0 ml/min, the elution solvent was tetrahydrofuran and the column temperature was 40° C.

—Copolymerization Ratio by Weight—

The copolymerization ratio by weight between the individual monomers was determined from the peak area ratios, of the $^1$H-NMR and $^{13}$C-NMR absorption spectra, due to the side chain groups of the individual monomers.

SYNTHESIS EXAMPLE 1

In a stainless steel autoclave equipped with a stirrer, a thermometer, a heater, a monomer-feeding pump, and a nitrogen-gas introducing device, 140 parts of ethylene glycol monobutyl ether was placed, the gas-phase portion in the autoclave was purged with nitrogen for 15 minutes, and the internal temperature was raised to 80° C. Then, while the internal temperature was being maintained at 80° C., a mixture composed of 10 parts of 2-acrylamido-2-methylpropanesulfonic acid, 50 parts of 2,2,3,3,3-pentafluoropropyl acrylate, 40 parts of methyl methacrylate and 2 parts of benzoyl peroxide was continuously added into the autoclave over a period of 3 hours. After completion of the addition, the reaction was allowed to proceed at 85 to 95° C. further for 2 hours, and then the reaction mixture was cooled to 25° C. Then, the reaction mixture was vacuum-dried to remove the solvent, and thus a copolymer (α) was obtained.

The copolymer (α) was found to have a Mw value of $3.0\times10^4$, and the copolymerization ratio by weight of 2-acrylamido-2-methylpropanesulfonic acid/2,2,3,3,3-pentafluoropropyl acrylate/methyl methacrylate was 10/51/39. The copolymer (α) is referred to as the "copolymer (A-1)."

SYNTHESIS EXAMPLE 2

In a separable flask equipped with a stirrer, a thermometer and a cooling tube, 170 parts of methanol was placed and methanol was subjected to bubbling with nitrogen gas for 15 minutes, and then 10 parts of 2-acrylamido-2-methylpropanesulfonic acid, 60 parts of 2,2,2-trifluoroethyl acrylate, 30 parts of ethyl acrylate and 4 parts of 2,2'-azobisisobutylonitrile were added into the flask, and the internal temperature was raised to 60° C. After one hour, the internal temperature was raised to 80° C., and the reaction was allowed to proceed further for 4 hours, and then the reaction mixture was cooled to 25° C. Then, the reaction mixture was vacuum-dried to remove the solvent, and thus a copolymer (α) was obtained.

The copolymer (α) was found to have a Mw value of $1.5\times10^4$, and the copolymerization ratio by weight of 2-acrylamido-2-methylpropanesulfonic acid/2,2,2-trifluoroethyl acrylate/ethyl acrylate was 10/59/31. The copolymer (α) is referred to as the "copolymer (A-2)."

SYNTHESIS EXAMPLE 3

In the same separable flask as in Synthesis Example 2, 170 parts of methanol was placed and the methanol was subjected to bubbling with nitrogen gas for 15 minutes, and then 20 parts of 2-acrylamido-2-methylpropanesulfonic acid, 80 parts of 2,2,3,3,3-pentafluoropropyl methacrylate and 4 parts of 2,2'-azobisisobutylonitrile were added into the flask, and the internal temperature was raised to 60° C. After one hour, the internal temperature was raised to 80° C., and the reaction was allowed to proceed further for 4 hours, and then the reaction mixture was cooled to 25° C. Then, the reaction mixture was vacuum-dried to remove the solvent, and thus a copolymer (α) was obtained.

The copolymer (α) was found to have a Mw value of $0.5\times10^4$, and the copolymerization ratio by weight of 2-acrylamido-2-methylpropanesulfonic acid/2,2,3,3,3-pentafluoropropyl methacrylate was 20/80. The copolymer (α) is referred to as the "copolymer (A-3)."

SYNTHESIS EXAMPLE 4

In the same autoclave as in Synthesis Example 1, 140 parts of ethylene glycol monobutyl ether was placed, the gas-phase portion in the autoclave was purged with nitrogen for 15 minutes, and the internal temperature was raised to 80° C. Then, while the internal temperature was being maintained at 80° C., a mixture composed of 20 parts of 2-acrylamido-2-methylpropanesulfonic acid, 60 parts of 2,2,3,3,3-pentafluoropropyl acrylate, 20 parts of methyl methacrylate and 2 parts of benzoyl peroxide was continuously added into the autoclave over a period of 3 hours. After completion of the addition, the reaction was allowed to proceed at 85 to 95° C. further for 2 hours, and then the reaction mixture was cooled to 25° C. Then, the reaction mixture was vacuum-dried to remove the solvent, and thus a copolymer (α) was obtained.

The copolymer (α) was found to have a Mw value of $4.8 \times 10^4$, and the copolymerization ratio by weight of 2-acrylamido-2-methylpropanesulfonic acid/2,2,3,3,3-pentafluoropropyl acrylate/methyl methacrylate was 21/60/19.

Then, the obtained copolymer (α) was dissolved in an aqueous solution containing ammonia in an amount equimolar to the placed amount of 2-acrylamido-2-methylpropanesulfonic acid to obtain a solution of a salt of the copolymer (α) having a solid content of 10%. The salt of the copolymer (α) is referred to as the "copolymer (A-4)."

SYNTHESIS EXAMPLE 5

In the same separable flask as in Synthesis Example 2, 170 parts of methanol was placed and the methanol was subjected to bubbling with nitrogen gas for 15 minutes. Then 10 parts of 2-methacryamido-2-methylpropanesulfonic acid, 50 parts of 2,2,2-trifluoroethyl acrylate, 40 weight parts of methyl methacrylate and 4 parts of 2,2'-azobisisobutylonitrile were added into the flask, and the internal temperature was raised to 60° C. After one hour, the internal temperature was raised to 70° C., and the reaction was allowed to proceed further for 5 hours, and then the reaction mixture was cooled to 25° C. Then, the reaction mixture was vacuum-dried to remove the solvent, and thus a copolymer (α) was obtained.

The copolymer (α) was found to have a Mw value of $3.8 \times 10^4$, and the copolymerization ratio by weight of 2-methacryamido-2-methylpropanesulfonic acid/2,2,2-trifluoroethyl acrylate/methyl methacrylate was Oct. 50, 1940.

Then, the obtained copolymer (α) was dissolved in an aqueous solution containing ammonia in an amount equimolar to the placed amount of 2-methacryamido-2-methylpropanesulfonic acid to obtain a solution of a salt of the copolymer (α) having a solid content of 10%. The salt of the copolymer (α) is referred to as the "copolymer (A-5)."

SYNTHESIS EXAMPLE 6

A copolymer (α) was obtained in the same manner as in Synthesis Example 5 except that a mixture composed of 150 parts of t-butanol and 20 parts of methanol was used as the polymerization solvent, and the placed monomers were 10 parts of 2-acrylamido-2-methylpropanesulfonic acid, 55 parts of 2,2,2-trifluoroethyl acrylate and 35 parts of 2-(perfluorooctyl)ethyl acrylate.

The copolymer (α) was found to have a Mw value of $9.9 \times 10^4$, and the copolymerization ratio by weight of 2-acrylamido-2-methylpropanesulfonic acid/2,2,2-trifluoroethyl acrylate/2-(perfluorooctyl)ethyl acrylate was 10/55/35. The copolymer (α) is referred to as the "copolymer (A-6)."

SYNTHESIS EXAMPLE 7

A copolymer (α) was obtained in the same manner as in Synthesis Example 5 except that 170 parts of t-butanol was used as the polymerization solvent, and the placed monomers were 5 parts of 2-methacryamido-2-methylpropanesulfonic acid, 65 parts of 2,2,2-trifluoroethyl acrylate and 30 parts of 2-(perfluorooctyl)ethyl acrylate.

The copolymer (α) was found to have a Mw value of $7.9 \times 10^4$, and the copolymerization ratio by weight of 2-methacryamido-2-methylpropanesulfonic acid/2,2,2-trifluoroethyl acrylate/2-(perfluorooctyl)ethyl acrylate was 5/66/29.

Then, the obtained copolymer (α) was dissolved in an aqueous solution containing triethanolamine in a half the molar amount of the placed 2-methacryamido-2-methylpropanesulfonic acid to obtain a solution of a salt of the copolymer (α) having a solid content of 10%. The salt of the copolymer (α) is referred to as the "copolymer (A-7)."

SYNTHESIS EXAMPLE 8

A copolymer (α) was obtained in the same manner as in Synthesis Example 5 except that 170 parts of t-butanol was used as the polymerization solvent, and the placed monomers were 10 parts of 2-acryamido-2-methylpropanesulfonic acid, 70 parts of 2,2,2-trifluoroethyl acrylate and 20 parts of 2-(perfluorooctyl)ethyl acrylate.

The copolymer (α) was found to have a Mw value of $9.0 \times 10^4$, and the copolymerization ratio by weight of 2-acryamido-2-methylpropanesulfonic acid/2,2,2-trifluoroethyl acrylate/2-(perfluorooctyl)ethyl acrylate was 10/70/20.

Then, the obtained copolymer (α) was dissolved in an aqueous solution containing triethanolamine in a half the molar amount of the placed 2-acryamido-2-methylpropanesulfonic acid to obtain a solution of a salt of the copolymer (α) having a solid content of 10%. The salt of the copolymer (α) is referred as the "copolymer (A-8)."

SYNTHESIS EXAMPLE 9

A copolymer (α) was obtained in the same manner as in Synthesis Example 5 except that 170 parts of t-butanol was used as the polymerization solvent, and the placed monomers were 20 parts of 2-methacryamido-2-methylpropanesulfonic acid, 40 parts of 2,2,2-trifluoroethyl acrylate and 40 parts of 2-(perfluorooctyl)ethyl acrylate.

The copolymer (α) was found to have a Mw value of $9.5 \times 10^4$, and the copolymerization ratio by weight of 2-methacryamido-2-methylpropanesulfonic acid/2,2,2-trifluoroethyl acrylate/2-(perfluorooctyl)ethyl acrylate was 20/39/41.

Then, the obtained copolymer (α) was dissolved in an aqueous solution containing triethanolamine in a half the molar amount of the placed 2-methacryamido-2-methylpropanesulfonic acid to obtain a solution of a salt of the copolymer (α) having a solid content of 10%. The salt of the copolymer (α) is referred as the "copolymer (A-9)."

EXAMPLES 1 TO 11

In each of Examples 1 to 11, an antireflection film-forming composition solution was obtained as follows: 100 parts of the (A) copolymer (salt) shown in Table 1 and 10 parts of FFTOP EF-112 as the (B) surfactant were added with water to prepare a solution having a solid content concentration of 3%, and then the solution was filtered with a membrane filter having a pore size of 0.2 μm to yield the antireflection film-forming composition solution.

Then, for each of the thus obtained antireflection film-forming composition solutions, the performance of the antireflection film formed thereof was evaluated on the basis of the formed resist pattern. The evaluation results thus obtained are shown in Table 1.

EXAMPLES 12 AND 13

In each of Examples 12 and 13, an antireflection film-forming composition solution was obtained as follows: 100 parts of the (A) copolymer (salt) shown in Table 1 and 10 parts of FFTOP EF-112 as the (B) surfactant were added with 1-butanol to prepare a solution having a solid content concentration of 3%, and then the solution was filtered with a membrane filter having a pore size of 0.2 μm to yield the antireflection film-forming composition solution.

Then, for each of the thus obtained antireflection film-forming composition solutions, the performance of the antireflection film formed thereof was evaluated on the basis of the formed resist pattern. The evaluation results thus obtained are shown in Table 1

COMPARATIVE EXAMPLES 1 TO 9

In each of Comparative Examples 1 to 9, an antireflection film-forming composition solution was obtained as follows: 100 parts of the (A) copolymer (salt) shown in Table 1 and 10 parts of sodium perfluoro-n-octanesulfonic acid (surface tension [25/0.1]=50 mN/m) as a surfactant were added with water to prepare a solution having a solid content concentration of 3%, and then the solution was filtered with a membrane filter having a pore size of 0.2 μm to yield the antireflection film-forming composition solution.

Then, for each of the thus obtained antireflection film-forming composition solutions, the performance of the antireflection film formed thereof was evaluated on the basis of the formed resist pattern. The evaluation results thus obtained are shown in Table 1.

COMPARATIVE EXAMPLES 10 AND 11

In each of Comparative Examples 10 and 11, an antireflection film-forming composition solution was obtained as follows: 100 parts of the (A) copolymer (salt) shown in Table 1 and 10 parts of sodium perfluoro-n-octanesulfonic acid (surface tension [25/0.1]=50 mN/m) as a surfactant were added with 1-butanol to prepare a solution having a solid content concentration of 3%, and then the solution was filtered with a membrane filter having a pore size of 0.2 μm to yield the antireflection film-forming composition solution.

Then, for each of the thus obtained antireflection film-forming composition solutions, the performance of the antireflection film formed thereof was evaluated on the basis of the formed resist pattern. The evaluation results thus obtained are shown in Table 1.

TABLE 1

| | (A) Component | Resolution (μm) | Developability | Pattern profile | Basic material blocking effect | Standing-wave effect | Microbubbles | Defects after development |
|---|---|---|---|---|---|---|---|---|
| Ex. 1 | A-1 | 0.25 | Good | Good | Good | Good | Absent | Absent |
| Ex. 2 | A-2 | 0.25 | Good | Good | Good | Good | Absent | Absent |
| Ex. 3 | A-3 | 0.25 | Good | Good | Good | Good | Absent | Absent |
| Ex. 4 | A-4 | 0.25 | Good | Good | Good | Good | Absent | Absent |
| Ex. 5 | A-5 | 0.25 | Good | Good | Good | Good | Absent | Absent |
| Ex. 6 | A-6 | 0.25 | Good | Good | Good | Good | Absent | Absent |
| Ex. 7 | A-7 | 0.25 | Good | Good | Good | Good | Absent | Absent |
| Ex. 8 | A-8 | 0.25 | Good | Good | Good | Good | Absent | Absent |
| Ex. 9 | A-9 | 0.25 | Good | Good | Good | Good | Absent | Absent |
| Ex. 10 | A-9 | 0.25 | Good | Good | Good | Good | Absent | Absent |
| Ex. 11 | A-9 | 0.25 | Good | Good | Good | Good | Absent | Absent |
| Ex. 12 | A-1 | 0.25 | Good | Good | Good | Good | Absent | Absent |
| Ex. 13 | A-9 | 0.25 | Good | Good | Good | Good | Absent | Absent |
| Com. Ex. 1 | A-1 | 0.25 | Good | Good | Good | Good | Present | Present |
| Com. Ex. 2 | A-2 | 0.25 | Good | Good | Good | Good | Present | Present |
| Com. Ex. 3 | A-3 | 0.25 | Good | Good | Good | Good | Present | Present |
| Com. Ex. 4 | A-4 | 0.25 | Good | Good | Good | Good | Present | Present |
| Com. Ex. 5 | A-5 | 0.25 | Good | Good | Good | Good | Present | Present |
| Com. Ex. 6 | A-6 | 0.25 | Good | Good | Good | Good | Present | Present |
| Com. Ex. 7 | A-7 | 0.25 | Good | Good | Good | Good | Present | Present |
| Com. Ex. 8 | A-8 | 0.25 | Good | Good | Good | Good | Present | Present |
| Com. Ex. 9 | A-9 | 0.25 | Good | Good | Good | Good | Present | Present |
| Com. Ex. 10 | A-1 | 0.25 | Good | Good | Good | Good | Present | Present |
| Com. Ex. 11 | A-9 | 0.25 | Good | Good | Good | Good | Present | Present |

INDUSTRIAL APPLICABILITY

The antireflection film-forming composition of the present invention has excellent coatability, is capable of remarkably suppression of the generation of microbubbles, has good wetting property for the resist coating film, is capable of preventing the degradation of the resist pattern by effectively blocking the penetration of the basic materials in the ambient atmosphere into the resist, is capable of sufficiently reducing the standing-wave effect by remarkably suppressing the reflection of radiation on the interface between an antireflection film and a resist coating film, and is capable of forming an antireflection film excellent in the solubility in water and an alkaline developer.

Additionally, according to the method of forming a resist pattern of the present invention using the above-mentioned antireflection film-forming composition, the effect due to the basic materials in the ambient atmosphere is not involved, the dimensional variation of the resist pattern can be suppressed to an extremely small extent even when the time interval between exposure and development is varied, the adverse effect of the standing-wave effect is not involved, the dimensional variation of the resist pattern can be suppressed to an extremely small extent even when level difference is present on the substrate surface or even when the composition and viscosity of the resist and the coating conditions of the resist and the like are varied, and thus, a high-accuracy fine resist pattern can be stably formed. Further, the method of forming a resist pattern of the present invention is excellent in the items including the resolution, developability, pattern profile, and coatability of the resist.

Accordingly, the present invention is a particularly significant contribution to the fabrication of integrated circuits with a high degree of integration.

The invention claimed is:

1. An antireflection film-forming composition comprising:
   (A) a copolymer having at least one repeating unit represented by the following formula (1) and at least one repeating unit represented by the following formula (2) and/or a salt of the copolymer; and
   (B) a fluorine-containing anionic surfactant, fluorine-containing cationic surfactant or fluorine-containing amphoteric surfactant, the surface tension of an aqueous solution of the surfactant at 25° C. and at a concentration of 0.1% b by weight being 45 mN/m or less:

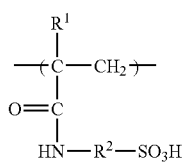

(1)

wherein in formula (1) $R^1$ represents a hydrogen atom or a monovalent organic group and $R^2$ represents a divalent organic group; and

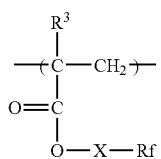

(2)

wherein in formula (2) $R^3$ represents a hydrogen atom or a monovalent organic group, Rf represents a fluoroalkyl group, and X represents a direct bond, an alkylene group or a fluoroalkylene group.

2. The antireflection film composition according to claim 1, further comprising a solvent comprising water and/or a monovalent alcohol.

3. The antireflection film-forming composition according to claim 1, wherein the content of the component (B) is 0.001 to 50% by weight in relation to the component (A).

4. The antireflection film composition according to claim 3, further comprising a solvent comprising water and/or a monovalent alcohol.

5. An antireflection film-forming composition comprising:
   (A) a copolymer having at least one repeating unit represented by the following formula (1) and at least one repeating unit represented by the following formula (2) and/or a salt of the copolymer;
   (B) a fluorine-containing anionic surfactant, fluorine-containing cationic surfactant or fluorine-containing amphoteric surfactant, the surface tension of an aqueous solution of the surfactant at 25° C. and at a concentration of 0.1% by weight being 45 mN/m or less; and
   (C) a fluoroalkylsulfonic acid having 4 to 12 carbon atoms or a salt thereof and/or a fluoroalkylcarboxylic acid having 4 to 12 carbon atoms or a salt thereof:

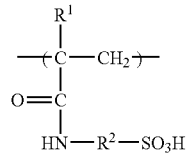

(1)

wherein in formula (1) $R^1$ represents a hydrogen atom or a monovalent organic group and $R^2$ represents a divalent organic group; and

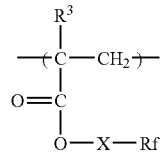

(2)

wherein in formula (2) $R^3$ represents a hydrogen atom or a monovalent organic group, Rf represents a fluoroalkyl group, and X represents a direct bond, an alkylene group or a fluoroalkylene group.

6. The antireflection film composition according to claim 5, further comprising a solvent comprising water and/or a monovalent alcohol.

7. The antireflection film-forming composition according to claim 5, wherein the content of the component (B) is 0.001 to 50% by weight in relation to the component (A) and the content of the component (C) is 0.001 to 50% by weight in relation to the component (B).

8. The antireflection film composition according to claim 7, further comprising a solvent comprising water and/or a monovalent alcohol.

9. A layered product fabricated by forming on a resist coating film an antireflection film formed of an antireflection film-forming composition, wherein the antireflection film-forming composition comprises:
   (A) a copolymer having at least one repeating unit represented by the following formula (1) and at least one repeating unit represented by the following formula (2) and/or a salt of the copolymer; and
   (B) a fluorine-containing anionic surfactant, fluorine-containing cationic surfactant or fluorine-containing amphoteric surfactant, the surface tension of an aqueous solution of the surfactant at 25° C. and at a concentration of 0.1% b by weight being 45 mN/m or less:

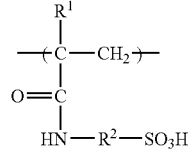

(1)

wherein in formula (1) $R^1$ represents a hydrogen atom or a monovalent organic group and $R^2$ represents a divalent organic group; and

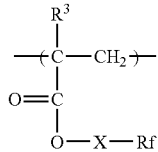
(2)

wherein in formula (2) $R^3$ represents a hydrogen atom or a monovalent organic group, Rf represents a fluoroalkyl group, and X represents a direct bond, an alkylene group or a fluoroalkylene group.

10. A method of forming a resist pattern on a substrate, the method comprising:

forming a resist coating film formed on a substrate;

forming, on said resist coating film, an antireflection film from an antireflection film-forming composition and thereafter irradiating said resist coating film with radiation in a predetermined pattern and then conducting development to remove said antireflection film, wherein the antireflection film-forming composition comprises:

(A) a copolymer having at least one repeating unit represented by the following formula (1) and at least one repeating unit represented by the following formula (2) and/or a salt of the copolymer, and (B) a fluorine-containing anionic surfactant, fluorine-containing cationic surfactant or fluorine-containing amphoteric surfactant, the surface tension of an aqueous solution of the surfactant at 25° C. and at a concentration of 0.1%b by weight being 45 mN/m or less:

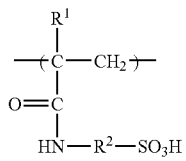
(1)

wherein in formula (1) $R^1$ represents a hydrogen atom or a monovalent organic group and $R^2$ represents a divalent organic group; and

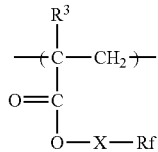
(2)

wherein in formula (2) $R^3$ represents a hydrogen atom or a monovalent organic group, Rf represents a fluoroalkyl group, and X represents a direct bond, an alkylene group or a fluoroalkylene group.

11. The method of forming a resist pattern according to claim 10, wherein the antireflection film and the resist coating film are simultaneously removed at the time of the development by conducting the development with an alkaline developer.

12. A layered product fabricated by forming on a resist coating film an antireflection film formed of an antireflection film-forming composition, wherein the antireflection film-forming composition comprises:

(A) a copolymer having at least one repeating unit represented by the following formula (1) and at least one repeating unit represented by the following formula (2) and/or a salt of the copolymer;

(B) a fluorine-containing anionic surfactant, fluorine-containing cationic surfactant or fluorine-containing amphoteric surfactant, the surface tension of an aqueous solution of the surfactant at 25° C. and at a concentration of 0.1% by weight being 45 mN/m or less; and (C) a fluoroalkylsulfonic acid having 4 to 12 carbon atoms or a salt thereof and/or a fluoroalkylcarboxylic acid having 4 to 12 carbon atoms or a salt thereof:

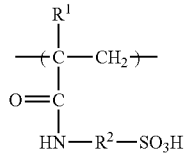
(1)

wherein in formula (1) $R^1$ a hydrogen atom or a monovalent organic group and $R^2$ represents a divalent organic group; and

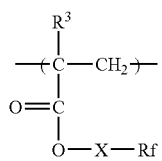
(2)

wherein in formula (2) $R^3$ represents a hydrogen atom or a monovalent organic group, Rf represents a fluoroalkyl group, and X represents a direct bond, an alkylene group or a fluoroalkylene group.

13. A method of forming a resist pattern on a substrate, the method comprising:

forming a resist coating film on a substrate;

forming, on said resist coating film, an antireflection film from an antireflection film-forming composition, and thereafter irradiating said resist coating film with radiation in a predetermined pattern and then conducting development to remove said antireflection film, wherein the antireflection film-forming composition comprises:

(A) a copolymer having at least one repeating unit represented by the following formula (1) and at least one repeating unit represented by the following formula (2) and/or a salt of the copolymer;

(B) a fluorine-containing anionic surfactant, fluorine-containing cationic surfactant or fluorine-containing amphoteric surfactant, the surface tension of an aqueous solution of the surfactant at 25° C. and at a concentration of 0.1% by weight being 45 mN/m or less; and (C) a fluoroalkylsulfonic acid having 4 to 12 carbon atoms or a salt thereof and/or a fluoroalkylcarboxylic acid having 4 to 12 carbon atoms or a salt thereof:

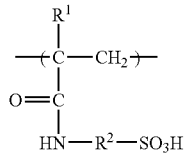
(1)

wherein in formula (1) $R^1$ a hydrogen atom or a monovalent organic group and $R^2$ represents a divalent organic group; and (2)

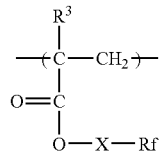

wherein in formula (2) $R^3$ represents a hydrogen atom or a monovalent organic group, Rf represents a fluoroalkyl group, and X represents a direct bond, an alkylene group or a fluoroalkylene group.

14. The method of forming a resist pattern according to claim 13, wherein that the antireflection film and the resist coating film are simultaneously removed at the time of the development by conducting the development with an alkaline developer.

* * * * *